(12) United States Patent  (10) Patent No.: US 6,580,121 B2
Hisamoto  (45) Date of Patent: Jun. 17, 2003

(54) POWER SEMICONDUCTOR DEVICE CONTAINING AT LEAST ONE ZENER DIODE PROVIDED IN CHIP PERIPHERY PORTION

(75) Inventor: Yoshiaki Hisamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/953,281

(22) Filed: Sep. 17, 2001

(65) Prior Publication Data
US 2002/0088991 A1 Jul. 11, 2002

(30) Foreign Application Priority Data
Jan. 10, 2001 (JP) ........................................ 2001-002449

(51) Int. Cl.[7] .............................................. H01L 29/76
(52) U.S. Cl. ...................... 257/328; 257/173; 257/356; 257/546
(58) Field of Search ................................ 257/355, 356, 257/359, 361, 546, 173, 328; 361/100

(56) References Cited

U.S. PATENT DOCUMENTS

| 3,648,129 A | * | 3/1972 | Nienhuis | 257/355 |
| 3,728,591 A | * | 4/1973 | Sunshine | 257/355 |
| 4,760,434 A | * | 7/1988 | Tsuzuki et al. | 257/49 |
| 5,012,313 A | * | 4/1991 | Fujihira | 257/328 |
| 5,204,988 A | * | 4/1993 | Sakurai | 257/356 |
| 5,304,802 A | * | 4/1994 | Kumagai | 257/328 |
| 5,557,127 A | * | 9/1996 | Ajit et al. | 257/339 |
| 5,736,779 A | * | 4/1998 | Kobayashi | 257/603 |
| 5,886,381 A | * | 3/1999 | Frisina | 257/328 |
| 5,959,345 A | * | 9/1999 | Fruth et al. | 257/605 |
| 6,246,092 B1 | * | 6/2001 | Fujihira et al. | 257/341 |

FOREIGN PATENT DOCUMENTS

| JP | 3-58-87873 | * | 5/1983 | 257/362 |
| JP | 4-03-209878 | * | 9/1991 | 257/328 |
| JP | 7-273320 | | 10/1995 | |
| JP | 8-172190 | | 7/1996 | |
| JP | 10-65157 | | 3/1998 | |

* cited by examiner

Primary Examiner—George Eckert
(74) Attorney, Agent, or Firm—Oblon, Spivak, McClelland, Maier & Neustadt, P.C.

(57) ABSTRACT

A Zener diode is provided in a chip periphery portion which entirely surrounds at a periphery a unit cell portion and a gate pad portion along first to fourth directions. The Zener diode has an $N^+$-P-$N^+$-P-$N^+$ structure consisting of an $N^+$ type layer, a P type layer, an $N^+$ type layer, a P type layer, and an $N^+$ type layer, in which these layers extend along the first to fourth directions. With this structure, a power semiconductor device achieves a higher electrostatic strength by (1) a reduction in on-state resistance through enlargement of an effective cell region by downsizing the gate pad, and (2) an improvement in current-voltage characteristic of the Zener diode through an increase in PN junction width.

6 Claims, 25 Drawing Sheets

F I G . 5
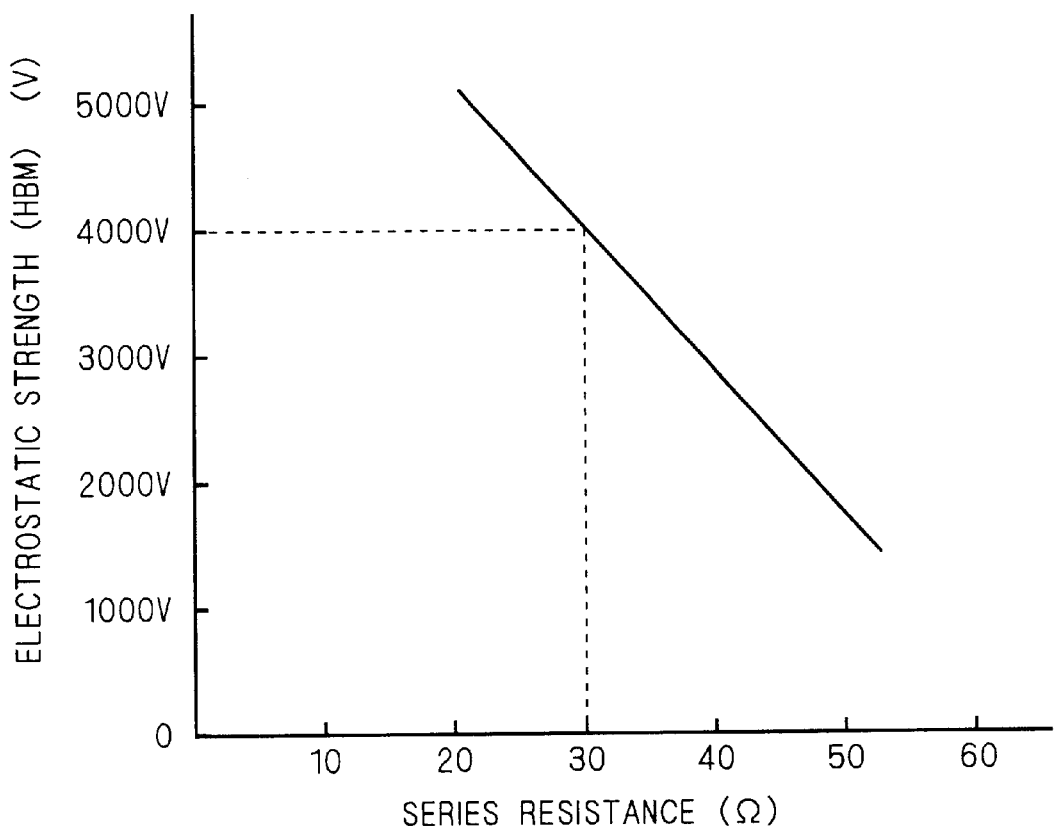

POWER SEMICONDUCTOR DEVICE CONTAINING AT LEAST ONE ZENER DIODE PROVIDED IN CHIP PERIPHERY PORTION

BACKGROUND OF THE INVENTION

1. Field of the Invention

The present invention relates to power semiconductor devices used as components for controlling power supplies in mobile devices such as mobile phones and digital still cameras, in peripheral devices of personal computers (e.g., liquid-crystal or CRT displays, printers, video tape recorders and DVD players), or in electronic devices mounted on vehicles, and relates more particularly to a power semiconductor device which has MOS-structure semiconductor elements (such as vertical power MOSFETs or IGBTs) with relatively-low withstand voltage (of e.g., less than 200 V) and at least one Zener diode, or input protection circuit, provided between a gate of the MOS-structure semiconductor elements and one main electrode thereof (a source of the vertical power MOSFETs or a cathode of the IGBTs).

2. Description of the Background Art

Conventionally, power-supply voltages of 10 V, 4 V or 2.5 V have been used to drive the power semiconductor devices for controlling the power supply. In the recent markets, however, particularly in the field of mobile devices such as mobile phones, the demand for lower-voltage-driven power semiconductor devices which are driven at 2.5 V or 1.5 V is escalating for the requirement of controlling charge and discharge of lithium-ion battery with lower consumption power. The markets are also intensively demanding, as well as the driving voltage reduction, improvements in device performance of the power semiconductor devices, such as on-state voltage reduction through reduction in on-state resistance of the MOS-structure semiconductor elements, and capacity reduction through further reduction in chip size. Moreover, the market and law regulations are even demanding that the power semiconductor devices should be equipped with input protection circuits for protecting gate insulating films of the MOS-structure semiconductor elements from various noises, such as static electricity produced from human body during handling of the devices or that produced from machines, lightning, electromagnetic waves and inrush currents produced during operation of car starters. For measures against such noises as static electricity, the power semiconductor devices are required to satisfy, for example, the EIAJ standards (Electronic Industries Association of Japan). That is to say, the HBM (Human Body Method) requires the products to meet the withstand voltage standard of 1000 V, and the MN (Machine Method) requires withstand voltage of 100 V or higher. As the markets are demanding products having higher withstand voltage characteristics, it is an urgent need to realize power semiconductor devices having withstand voltage characteristics superior to those required by the EIAJ standards.

To satisfy such demands from customers, recent power-supply-controlling power semiconductor devices are even equipped with Zener diodes as the input protection circuits for protecting the MOS-structure semiconductor elements. For example, as the market for mobile phones grows, chips having an area of 2 mm$^2$ and input capacity which corresponds to 1000 pF have been appearing on the market as Zener-diode-containing vertical power MOSFET devices. In the field of mobile phones where the products have withstand voltages of 20 to 30 V, particularly, there is an intensive demand for products with lower withstand voltage and lower on-state resistance.

FIG. 20 is a plan view showing a Zener diode forming an input protection circuit for trench-type n-type MOSFETs, where the shape of a gate electrode 6PP is depicted schematically rather than exactly. FIG. 21 is the vertical section taken along the line AP-BP in FIG. 20. For convenience of description, FIG. 20 does not show a passivation film 10PP shown in FIG. 21.

In FIGS. 20 and 21, a semiconductor substrate 100PP is composed of an N$^+$ substrate 9PP and an N$^-$ epitaxial layer 8PP; a surface of the N$^-$ epitaxial layer 8PP, which forms a main surface of the semiconductor substrate 100PP, is covered by an insulating film 7PP, and an N$^+$ type layer 1PP1 is formed on a surface 7SPP of the insulating film 7PP. A P type layer 31PP is formed along the periphery of the N$^+$ type layer 1PP1 and thus entirely surrounds it, an N$^+$ type layer 32PP is formed along the periphery of the P type layer 31PP and thus entirely surrounds it, and a P type layer 33PP is formed along the periphery of the N$^+$ type layer 32PP and thus entirely surrounds it; the layers 31PP, 32PP and 33PP form a PN junction region 3PP. Further, an N$^+$ type layer 1PP2, the outermost layer, is formed along the periphery of the PN junction region 3PP and thus entirely surrounds it. In this way, the semiconductor regions are formed so that the N$^+$ type layer 1PP1 in the center is surrounded by the P type and N type layers in series, thereby forming a Zener diode 11PP having an N$^+$-P-N$^+$-P-N$^+$ structure. The passivation film 10PP is formed on the surface of the Zener diode 11PP; the passivation film 10PP has a gate-side contact region 4PP formed over the N$^+$ type layer 1PP1 and a source-side contact region 2PP formed over the N$^+$ type layer 1PP2. A gate electrode 6PP is formed in the gate-side contact region 4PP, and a source electrode 5PP is formed in a surface of the passivation film 10PP around a gate pad formation region and fills the source-side contact region 2PP. A drain electrode 12PP is formed on a back surface of the N$^+$ substrate 9PP.

As described above, in the conventional Zener-diode-containing vertical power MOSFET device, the Zener diode 11PP having N$^+$-P-N$^+$-P-N$^+$ structure is provided right under the gate pad and its vicinity in the main surface of the semiconductor substrate 100PP.

When applying wire-bonding to the gate electrode in the gate pad so as to package the IC, gold (Au) wire having a diameter of 50 μm is usually used. For this process, a square gate pad must be sized to offer an area which corresponds to 200 μm×200 μm at least.

Suppose that a Zener diode is formed as shown in FIGS. 20 and 21 right under a gate pad having an area which corresponds to 200 μm×200 μm and in its vicinity in a vertical power MOSFET device (the peripheral length of the gate pad is 0.8 mm). When the electrostatic strength of this vertical power MOSFET device is measured by using an electrostatic strength testing circuit for HBM as shown in FIG. 22, it shows the current-voltage (I–V) characteristic as shown by the broken line in FIG. 6. That is to say, since the withstand voltage value of the Zener diode increases in proportion to the current, the voltage value may exceed the breakdown voltage limit of the gate insulating film, depending on the current value. Accordingly, in this case, the provision of the Zener diode offers no effect at all. Furthermore, as shown in FIG. 23 (FIG. 23 shows data which has not been disclosed before and it plots the lowest values of the measurements), the operating resistance, or the series resistance, of the Zener diode in this case is about 100

Ω, in which case the electrostatic strength (HBM(+)) is even lower than 1000 V, which is far from satisfying the desired standard value (=1500 V) which the inventor of this invention expects. It is thus understood that disposing a Zener diode right under, and in the vicinity of, the gate pad having a peripheral length of 0.8 mm provides no effect.

Accordingly, the inventor of this invention carried out attempts to increase the area or the peripheral length of the gate pad, i.e., to increase the area of a Zener diode formation region right under the gate pad. FIG. 24 shows the tested results (data which has not been disclosed before). As shown in FIG. 24, as the gate pad area or the PN junction width of the Zener diode increases (the PN junction width is the length along the periphery of a PN junction face), the current-voltage (I–V) characteristic curve shifts to the left in FIG. 24, i.e., the curve becomes steeper. This shows that the operating resistance decreases and the Zener diode effect is enhanced. Analyzing this phenomenon on the basis of FIGS. 23 and 25 (not disclosed before) and FIG. 26 (FIG. 26 shows data which has not been disclosed before and it plots mean values of the measurements) shows the following. That is to say, when the data is evaluated at the lowest values of measurements, the withstand voltage can be 1000 V at the operating resistance of 30 Ω (HBM(+) is the withstand voltage value upon application of a positive bias and HBM (−) is that upon application of a negative bias), in which case the PN junction width is 1.6 mm. In other words, when the peripheral length of the gate pad is set to 1.6 mm, or when the length of one side of the gate pad is 400 μm, twice that of the conventional one, the mean withstand voltage is 4000 V or higher, which sufficiently satisfies the above-stated desired standard value (=1500 V).

It is thus understood that a Zener-diode-containing vertical power MOSFET device which satisfies the withstand voltage standard can be realized by forming the gate pad having an area which corresponds to 400 μm×400 μm. When such a large-area gate pad is used and a built-in Zener diode is formed right under the gate pad, however, the rate of occupied area of the gate pad in the whole device reaches as much as 18% and that of the unit cell portion is necessarily reduced. This problem becomes more serious as the chip is smaller-sized. In this respect, in the above-described conventional product having the gate pad area of 200 μm×200 μm, the rate of occupied area of the gate pad is no more than 2% and therefore the above problem hardly rises even when the chip is smaller-sized.

Thus, considering that wire-bonding using 50-μm gold (Au) wire essentially requires a gate pad having an area which corresponds to 200 μm×200 μm, and that such a gate pad as has this area does not cause the above-described problem even when the chip size is reduced, a Zener-diode-containing power semiconductor device is being demanded which adopts a gate pad whose one side is 200 μm long, to achieve size reduction and allow increased effective area for the unit cell portion, and which can achieve reduced operating resistance of the Zener diode, and hence a withstand voltage equal to or higher than the above-stated desired standard value (=1500 V), so as to prevent deterioration of the characteristics of the gate insulating film.

SUMMARY OF THE INVENTION

The present invention is directed to a power semiconductor device. According to a first aspect of the present invention, the power semiconductor device comprises: a semiconductor substrate; a unit cell portion comprising a plurality of MOS-structure power semiconductor elements formed on a first region which occupies the central part of a main surface of the semiconductor substrate, the unit cell portion comprising a recessed part; a gate pad portion comprising a wire-bonding-target gate electrode formed over a second region surrounded by the recessed part of the unit cell portion in the main surface of the semiconductor substrate; and a chip periphery portion comprising at least one Zener diode formed over a third region entirely surrounding the periphery of the unit cell portion in the main surface of the semiconductor substrate.

According to a second aspect of the present invention, in the power semiconductor device of the first aspect, the chip periphery portion comprises one Zener diode, and the Zener diode comprises n semiconductor regions arranged one outside another from the first region located on the side of the periphery of the unit cell portion to the n-th region located on the side of the periphery of the semiconductor substrate, the n semiconductor regions having alternating conductivity types and forming junctions one surrounding another along the periphery of the semiconductor substrate, the n being an odd number of three or larger.

According to a third aspect of the present invention, in the power semiconductor device of the first aspect, the chip periphery portion comprises a plurality of first Zener diodes, and a plurality of second Zener diodes, and in the power semiconductor device of the third aspect, each of the plurality of first Zener diodes comprises n semiconductor regions arranged one outside another from the first semiconductor region having a first conductivity type and located in the center, the n semiconductor regions having alternating conductivity types and forming junctions one surrounding another, the n being an odd number of three or larger, the n-th semiconductor region in each of the plurality of first Zener diodes having the first conductivity type, the first semiconductor region in each of the plurality of first Zener diodes being electrically connected, through a first contact hole formed on a surface of the first semiconductor region, to the wire-bonding-target gate electrode in the gate pad portion and to a first gate electrode layer of a corresponding first MOS-structure power semiconductor element provided in the unit cell portion, the n-th semiconductor region which is the outermost one in each of the plurality of first Zener diodes being electrically connected, through a second contact hole formed on a surface of the n-th semiconductor region, to one main electrode layer of the first MOS-structure power semiconductor element in the unit cell portion, and in the power semiconductor device of the third aspect, each of the plurality of second Zener diodes comprises n semiconductor regions arranged one outside another from the first semiconductor region having the first conductivity type and located in the center, the n semiconductor regions having alternating conductivity types and forming junctions one surrounding another, the n being an odd number of three or larger, the n-th semiconductor region in each of the plurality of second Zener diodes having the first conductivity type, the n-th semiconductor region which is the outermost one in each of the plurality of second Zener diodes being electrically connected, through a third contact hole formed on a surface of the n-th semiconductor region, to the wire-bonding-target gate electrode in the gate pad portion and to a second gate electrode layer of a corresponding second MOS-structure power semiconductor element in the unit cell portion, the first semiconductor region in each of the plurality of second Zener diodes being electrically connected, through a fourth contact hole formed on a surface of the first semiconductor region, to one main electrode layer of the second MOS-structure power semiconductor element in the unit cell portion, the first gate electrode layer and the second gate electrode layer being electrically connected to each other.

According to a fourth aspect of the present invention, in the power semiconductor device of the third aspect, a first sum total of first areas of the first contact holes of the plurality of first Zener diodes and third areas of the third contact holes of the plurality of second Zener diodes is equal to a second sum total of second areas of the second contact holes of the plurality of first Zener diodes and fourth areas of the fourth contact holes of the plurality of second Zener diodes.

According to a fifth aspect of the present invention, in the power semiconductor device of the fourth aspect, the plurality of first Zener diodes and the plurality of second Zener diodes are alternately arranged along the periphery of the semiconductor substrate.

According to a sixth aspect of the present invention, in the power semiconductor device of the fifth aspect, a common gate electrode layer is formed between adjacent ones of the first Zener diodes and the second Zener diodes in the chip periphery portion, the common gate electrode layer being connected to both of the first gate electrode layer and the second gate electrode layer, and the first semiconductor region of the first Zener diode and the n-th semiconductor region of the second Zener diode are electrically connected to each other through a fifth contact hole formed on a surface of the common gate electrode layer and a gate electrode interconnection filling the fifth contact hole.

In the power semiconductor device of the first aspect of the present invention, since the Zener diode is provided in the chip periphery portion, the rate of occupied area of the gate pad portion in the semiconductor device can be remarkably reduced and as a result, it becomes possible to easily realize enlargement of the effective cell region of each semiconductor element in the unit cell portion and ensure reduction of on-state resistance and on-state voltage.

In the power semiconductor device of the second aspect of the present invention, it is possible to remarkably increase the PN junction width of one Zener diode and achieve a significant improvement in current-voltage characteristic of the Zener diode through remarkably reduction in operating resistance of the Zener diode. The present invention can thus provide a power semiconductor device having a greatly enhanced function of protecting the gate insulating film from noises such as static electricity.

In the power semiconductor device of the third aspect of the present invention, since further increase in PN junction width (further reduction in operating resistance) can be achieved as compared with that in the second aspect, it is possible to realize more significant improvement in current-voltage characteristic and further enhancement in protection function against noises such as static electricity. The third aspect also produces an effect of enabling easy and flexible control of the amount of increase in PN junction width or the amount of reduction in operating resistance.

In the power semiconductor device of the fourth aspect of the present invention, it is possible to obtain symmetric bidirectionality in the current-voltage characteristics of the Zener diodes, while further enhancing the Zener diode effect (input protection function).

In the power semiconductor device of the fifth aspect of the present invention, the Zener diode effect (input protection function) can be further enhanced easily and certainly, and the symmetrical bidirectionality of the current-voltage characteristics of the Zener diodes can be achieved easily and certainly.

In the power semiconductor device of the sixth aspect of the present invention, the gate electrode interconnection is facilitated and the Zener diode effect can be further enhanced by utilizing the proximate interconnection structure.

The present invention has been made to meet the above-described technical demands, thereby realizing a power semiconductor device which can achieve the objects below.

(1) A first object of the present invention is to downsize the gate pad portion (the target rate of its occupied area is about 2%) for ensuring enlargement of the effective area for the cell operation region (also referred to as cell active region) in the unit cell portion of a small-size small-capacity chip, leading to reduction in on-state resistance or on-state voltage.

(2) A second object of the present invention is to ensure enhancement in electrostatic strength through reduction in operating resistance by improvement in I–V characteristic of the Zener diodes, and to thereby achieve products highly resistant to noises such as static electricity.

(3) A third object of the present invention is to make it possible to freely adjust and control the operating resistance of the Zener diodes.

(4) A fourth object of the present invention is to achieve symmetrical bidirectionality in the I–V characteristic of the Zener diodes.

(5) A fifth object of the present invention is to realize easier and shorter gate electrode interconnection for further enhancement in input protection effect of the Zener diodes.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing a relation between an operating resistance and electrostatic strength in Zener-diode-containing power semiconductor devices of the preferred embodiments;

DESCRIPTION OF THE PREFERRED EMBODIMENTS

Figure 1:
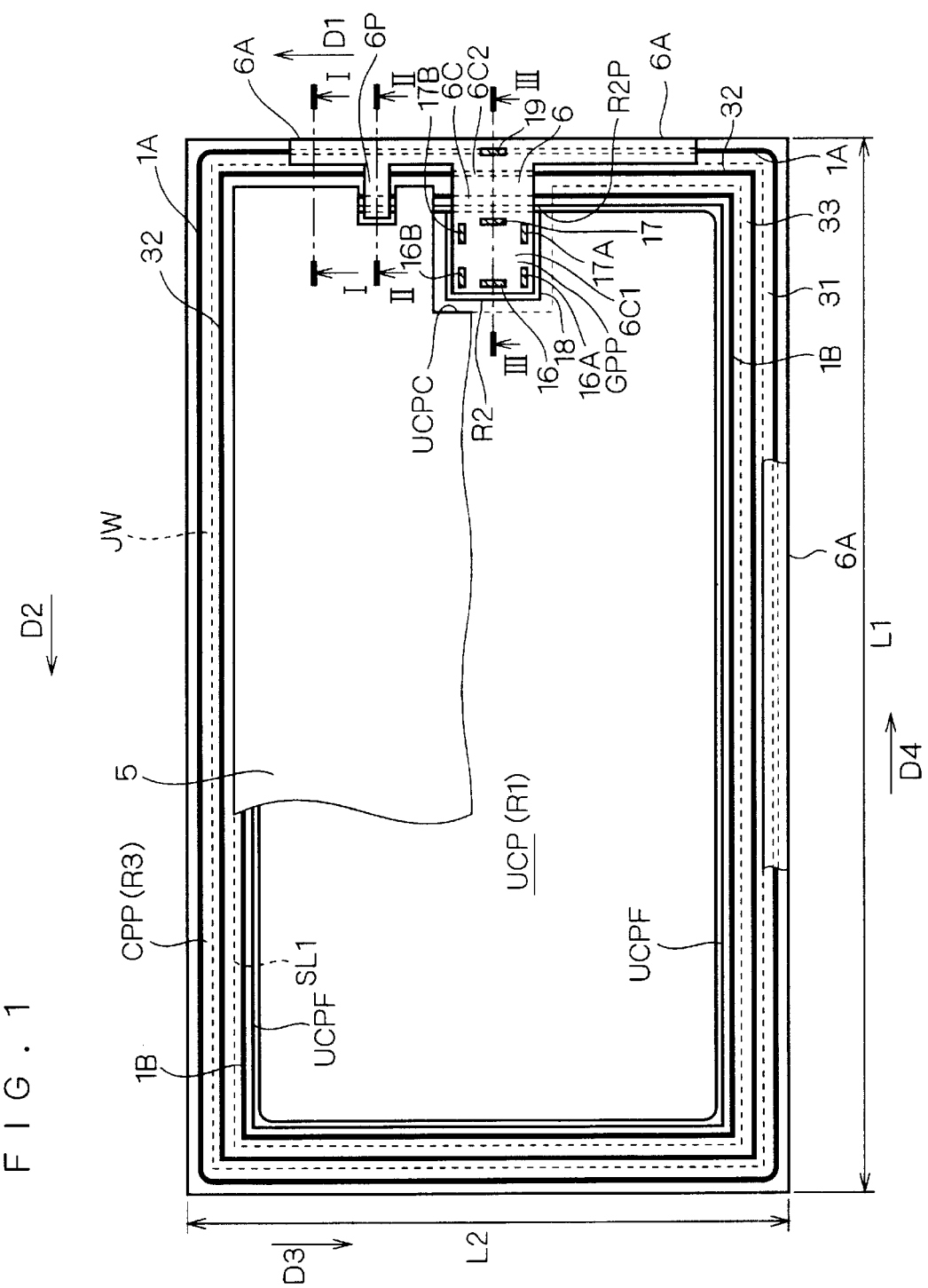
FIG. 1 is a plan view showing a structure of a Zener-diode-containing power semiconductor device in accordance with a first preferred embodiment.

A Zener-diode-containing power semiconductor device in accordance with the present invention comprises: (1) a unit cell portion composed of a plurality of MOS-structure power semiconductor elements formed on a first region which occupies the central part of a main surface of a semiconductor substrate; (2) a gate pad portion including a wire-bonding-target portion of a gate electrode formed over a second region, which is surrounded by a recess formed in the unit cell portion, in the main surface of the semiconductor substrate; and (3) a chip periphery portion having at least one Zener diode formed over a third region which, in the main surface of the semiconductor substrate, entirely surrounds the periphery of the unit cell portion and the gate pad portion along a first direction, a second direction, a third direction and a fourth direction which will be described later.

According to a first preferred embodiment described later, the chip periphery portion has one Zener diode having an $N^+$-P-$N^+$-P-$N^+$ structure where P type semiconductor regions and $N^+$ type semiconductor regions alternate with each other between the periphery of the semiconductor substrate and the $N^+$ type semiconductor region which adjoins the periphery of the unit cell portion and extends along the four directions, i.e., the first to fourth directions, to entirely surround the periphery of the unit cell portion.

According to a second preferred embodiment described later, the chip periphery portion comprises first Zener diodes and second Zener diodes which have different interconnection structures and are alternately arranged at equal intervals. Each of the first Zener diodes has an $N^+$-P-$N^+$-P-$N^+$ structure which includes an innermost, central $N^+$ type semiconductor region connected to the gate electrode and an outermost $N^+$ type semiconductor region connected to a source electrode. Each of the second Zener diodes has an $N^+$-P-$N^+$-P-$N^+$ structure which includes an innermost, central $N^+$ type semiconductor region connected to the source electrode and an outermost $N^+$ type semiconductor region connected to the gate electrode.

According to a third preferred embodiment described later, the chip periphery portion comprises common gate electrode layers each formed over the part of the main surface of the semiconductor substrate located between adjacent ones of the first and second Zener diodes.

The preferred embodiments will now be fully described referring to the drawings, where the MOS-structure power semiconductor elements formed on the first region are trench-type MOSFETs. Needless to say, the present invention can be applied also to devices which use vertical power MOSFETs, such as planar MOSFETs (DMOSFETs) or V-type MOSFETs, or IGBTs as the MOS-structure power semiconductor elements.

(First Preferred Embodiment)

FIG. 1 is a plan view showing an entire structure of a Zener-diode-containing power semiconductor device in accordance with the first preferred embodiment. While, in effect, a source electrode 5 made of aluminum (Al) is formed all over the area surrounded by a broken line SL1 in FIG. 1, FIG. 1 only shows part of the source electrode 5 for the sake of simplicity of the drawing. Also for simplicity, FIG. 1 only shows the fragment of a peripheral part 6A of a gate electrode 6 which extends in a first direction D1 and joins and intersects a central part 6C of the gate electrode 6 to form a T-shape together; the peripheral part 6A of the gate electrode 6, in effect, is an integrated part which extends in the first direction D1, in a second direction D2 perpendicular to the first direction D1, in a third direction D3 perpendicular to the second direction D2 and opposite to the first direction D1, and in a fourth direction D4 perpendicular to the third direction D3 and the first direction D1 and opposite to the second direction D2. Furthermore, for simplicity, FIG. 1 only shows the gate electrode 6 as having one protrusion 6P, but in fact, the gate electrode 6 has a plurality of protrusions 6P which extend into a unit cell portion UCP from arbitrary positions of its peripheral part 6A.

Figure 2:
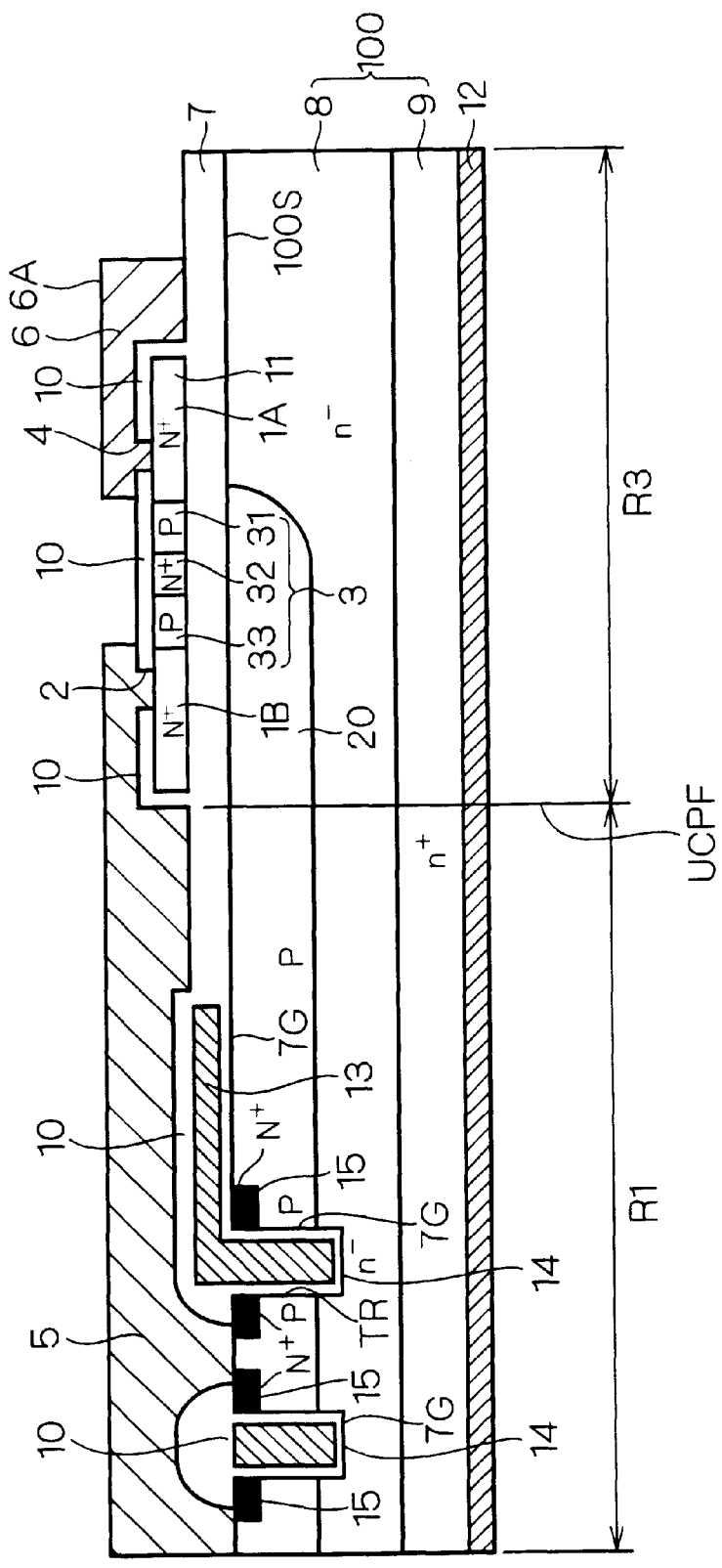
FIGS. 2 to 4 are vertical sections showing the structure of the Zener-diode-containing power semiconductor device in accordance with the first preferred embodiment.
Figure 3:
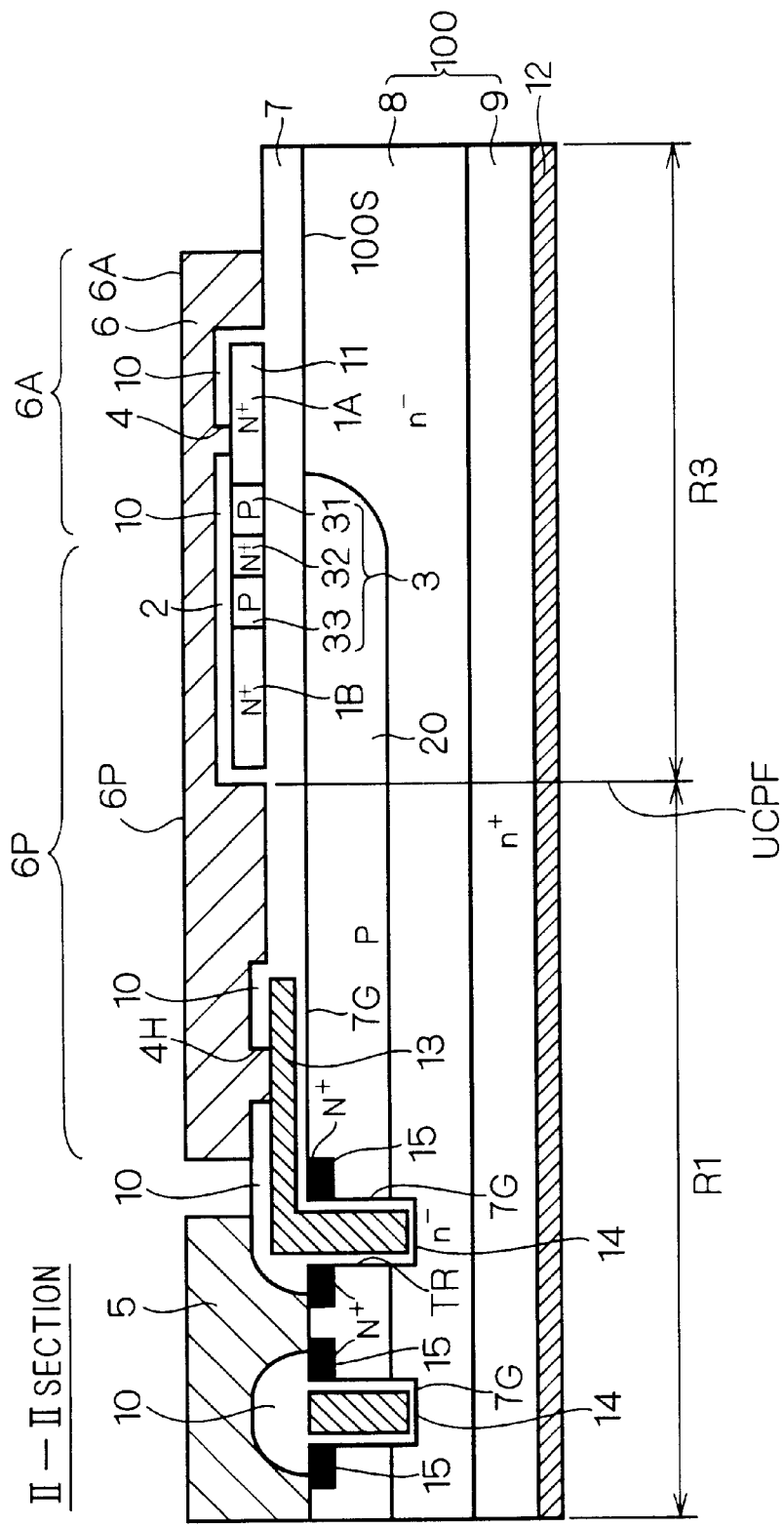
Figure 4:
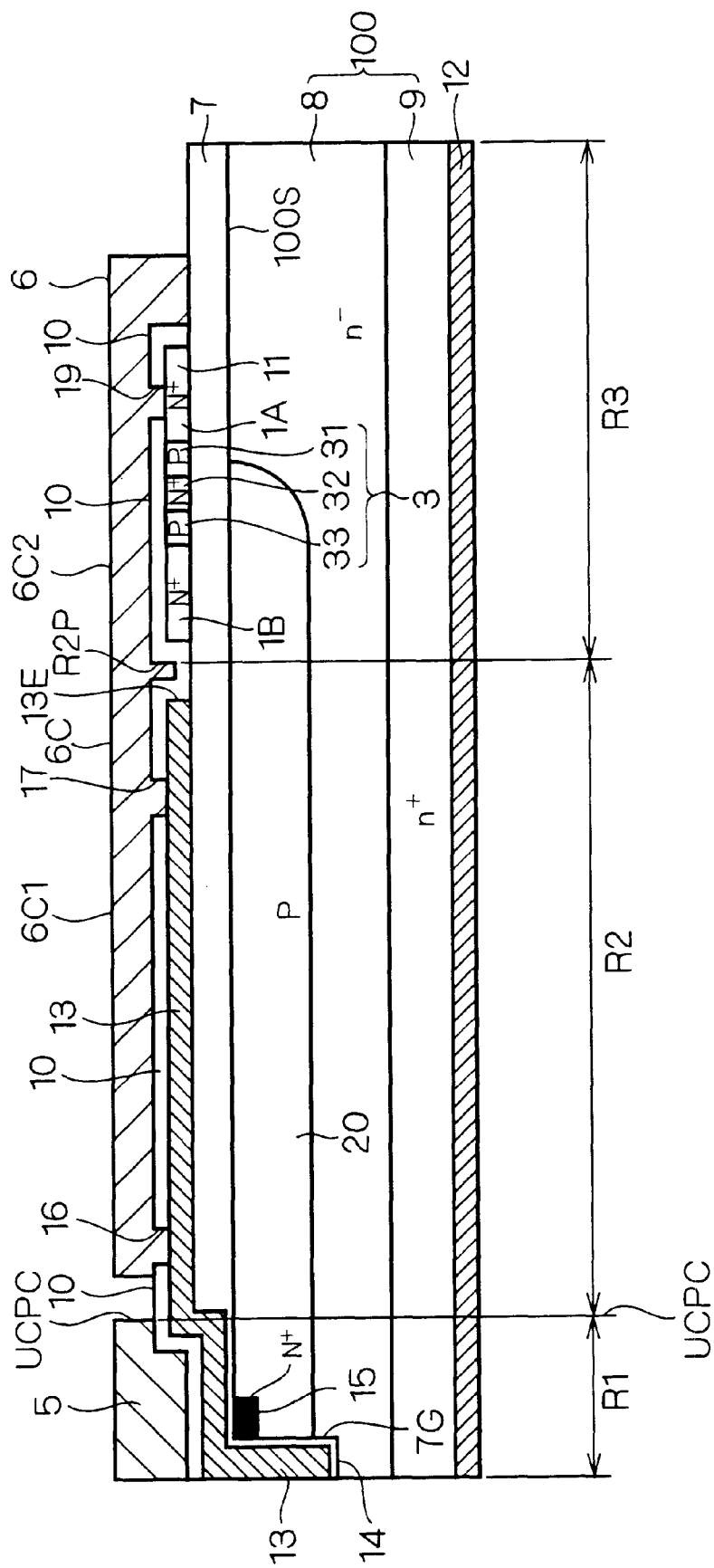

FIGS. 2, 3 and 4 are the vertical sections taken along the lines I—I, II—II and III—III of FIG. 1, respectively.

As shown in FIGS. 1 to 4, a semiconductor substrate 100 is formed of an $N^+$ substrate 9 and an $N^-$ epitaxial layer 8, a surface of the $N^-$ epitaxial layer 8 forming a main surface 100S of the semiconductor substrate 100. A plurality of trench-type MOSFETs 14 are formed on a part which corresponds to a first region R1 of the main surface 100S of the semiconductor substrate 100. As is known, each trench-type MOSFET 14 comprises: (1) a trench TR which extends from the main surface 100S through a P type well layer 20 formed in the $N^-$ epitaxial layer 8 to reach the inside of the $N^-$ epitaxial layer 8 right under the P type well layer 20, (2) a gate oxide film, or a gate insulating film 7G, formed on walls and a bottom of the trench TR and on the main surface 100S around the trench TR, (3) a doped polysilicon layer 13 (which may be referred to also as a gate electrode layer of the trench-type MOSFET 14) which entirely fills, and protrudes over, the trench TR covered by the gate insulating film 7G and extends over, and in parallel with, the main surface 100S around the trench TR toward a third region R3, (4) two $N^+$ type source regions 15 each formed in the P type well layer 20 in the vicinity of the edge where the trench TR and the part of the main surface 100S around the trench TR meet, and (5) a passivation film 10 which covers exposed one of the source regions 15 and an exposed surface of the doped polysilicon layer 13. The part or region where these trench-type MOSFETs 14 are formed is referred to as a unit cell portion UCP. As shown in FIG. 1, this unit cell portion UCP extends over the central part of the main surface 100S of the semiconductor substrate 100 to an outer frame portion UCPF shown in FIG. 1, thus occupying most part of a region on the main surface 100S of the semiconductor substrate 100. As already stated, the unit cell portion UCP has a number of MOS-structure semiconductor elements integrated in a stripe or mesh structure.

Next, a structure of a gate pad portion GPP formed on a second region R2 of the main surface 100S of the semiconductor substrate 100 will be described referring to FIGS. 1 and 4.

The gate pad portion GPP includes (1) the second region R2 in the main surface 100S of the semiconductor substrate 100 and (2) the part formed over the region R2. The second region R2 is surrounded by a recess UCPC receding in the second direction D2 from the central part of the outer side of the unit cell portion UCP which extends along the first direction D1. A first part 6C1 of the central part 6C of the gate electrode 6 is so located over the second region R2 of the main surface 100S of the semiconductor substrate 100 as to be positioned in a frame of a gate pad 18 which is a square region whose one side is, e.g., 200 $\mu$m. That is to say, an insulating film or oxide film 7, which is integrally connected to the gate insulating film 7G, is formed all over the second region R2 of the main surface 100S of the semiconductor substrate 100, extending also onto a third region R3 described later which adjoins the second region R2. Further, the doped polysilicon layer 13 of the trench-type MOSFET 14, extending from part of the doped polysilicon layer 13 located on the gate insulating film 7G, is formed on a surface of the insulating film 7 in the second region R2, and one end 13E of the doped polysilicon layer 13 stops short of a boundary between the second region R2 and the third region R3. Furthermore, the insulating film, or passivation film 10, is entirely formed on an exposed surface of the doped polysilicon layer 13 in the second region R2 and an exposed surface of a Zener diode 11 described later in the adjacent third region R3, and six contact holes 16, 16A, 16B, 17, 17A and 17B, shown in FIGS. 1 and 4, which are provided right under the gate electrode are formed in the passivation film 10 of the second region R2. In addition to these, one contact hole 19, shown in FIG. 4, which is provided right under the gate electrode is also formed in the passivation film 10 of the adjacent third region R3. The gate electrode 6 is so formed on an exposed surface of the passivation film 10 provided across the second region R2 and the adjacent third region R3 as to fill all the right-under-gate-electrode contact holes 16, 16A, 16B, 17, 17A, 17B and 19. Electrical contact between the first part 6C1 of the central part 6C of the gate electrode 6, which is located over the second region R2, and the doped polysilicon layer 13 extending onto the second region R2 is achieved through the right-under-gate-electrode contact holes 16, 16A, 16B, 17, 17A and 17B, and moreover electrical contact between a second part 6C2 of the central part 6C of the gate electrode 6 extending in the second direction D2 or the fourth direction D4, which is located over the third region R3 on the side of the periphery of the substrate and connected to the first part 6C1 and a fifth semiconductor region 1A of the Zener diode 11 described later (which corresponds to the n-th semiconductor region (n is an odd number of three or larger)) is achieved through the right-under-gate-electrode contact hole 19. Thus, in this Zener-diode-containing power semiconductor device, the gate pad 18 is a small region having an area which corresponds to 200 $\mu$m$^2$ (for example, the rate of occupied area of the gate pad 18 to the area of a chip which corresponds to 2 mm$^2$ is no more than about 2%), which is equivalent to size of the gate pad of the background-art product which can not produce the Zener diode effect. Moreover, in this power semiconductor device, the Zener diode does not exist in a region right under the first part 6C1 of the gate electrode 6 (which corresponds to the wire-bonding-target gate electrode) and its vicinity, i.e., in the second region R2. This conversely allows the small-sized gate pad 18 of which the rate of occupied area is about 2%. The size reduction of the gate pad 18 allows larger cell operation region in the unit cell portion UCP, thus enabling lower on-state resistance or lower on-state voltage in the cell operation region.

Next, a structure of the chip periphery portion CPP in the third region R3 of the main surface 100S of the semiconductor substrate 100 will be described referring to FIGS. 1 to 3.

The chip periphery portion CPP has one Zener diode 11. This is now described in detail. Specifically, the chip periphery portion CPP includes the third region R3 of the main surface 100S of the semiconductor substrate 100, one Zener diode 11 formed over the third region R3 and the like. The third region R3 is a region which completely surrounds the periphery or the outer frame portion UCPF of the unit cell portion UCP or the first region R1 and an outer side R2P (the periphery on the side not facing the recess UCPC) of the second region R2 which corresponds to the gate pad portion GPP in the first direction D1 perpendicular to the longitudinal direction or the protruding direction of the central part 6C (=the first part 6C1+the second part 6C2) of the gate electrode 6, the second direction D2 parallel to the extending direction of a longer side of the chip having a first length L1 (e.g., 2 mm), the third direction D3 parallel to the extending direction of a shorter side of the chip having a second length L2 (e.g., 1 mm) and the fourth direction D4.

The first preferred embodiment is particularly characterized in the arrangement and position of the Zener diode 11. Specifically, on the third region R3 of the main surface 100S of the semiconductor substrate 100 entirely formed is the insulating film 7 extending from each of the first region R1 and the second region R2 adjacent to the third region R3. The Zener diode 11 is provided on a surface of the insulating film 7 in the third region R3. More specifically, it is constructed as below. First, the Zener diode 11 has (1) a first semiconductor region 1B of a first conductivity type (N$^+$ type in this example), which is located on the side of the periphery UCPF of the unit cell portion UCP and extends along the first direction D1, the second direction D2, the third direction D3 and the fourth direction D4 to completely surround the periphery UCPF of the first region R1 and the periphery R2P of the second region R2. This first semiconductor region 1B is the innermost N$^+$ type semiconductor region. The Zener diode 11 also has (2) a second semiconductor region 33 of a second conductivity type (P type in this example), which extends along the first direction D1, the second direction D2, the third direction D3 and the fourth direction D4 to entirely join to a peripheral edge of the first semiconductor region 1B. The Zener diode 11 further has (3) a third semiconductor region 32 of the first conductivity type (N$^+$ type), which extends along the first direction D1, the second direction D2, the third direction D3 and the fourth direction D4 to entirely join to a peripheral edge of the second semiconductor region 33. This third semiconductor region 32 is the midmost N$^+$ type semiconductor region. Furthermore, the Zener diode 11 has (4) a P type fourth semiconductor region 31 which extends along the first direction D1, the second direction D2, the third direction D3 and the fourth direction D4 to entirely join to a peripheral edge of the third semiconductor region 32. The second semiconductor region 33, the third semiconductor region 32 and the fourth semiconductor region 31 form a PN junction region 3. The Zener diode 11 further has (5) the N+ type fifth semiconductor region 1A which extends along the first direction D1, the second direction D2, the third direction D3 and the fourth direction D4 to entirely join to a peripheral edge of the fourth semiconductor region 31. The fifth semiconductor region 1A is a semiconductor region which is located on the side of the periphery of the semiconductor substrate 100, i.e., the outermost N+ type n-th semiconductor region (n is five in this example).

As described above, the Zener diode 11 is composed of the n semiconductor regions from the N+ type first semiconductor region 1B completely surrounding the periphery UCPF of the unit cell portion UCP in its vicinity to the N+0 type n-th (n is an odd number of three or larger) semiconductor region completely surrounding the periphery UCPF of the unit cell portion UCP on the side of the periphery of the semiconductor substrate 100, which have alternating conductivity types and form PN junctions one outside another along the first direction D1, the second direction D2, the third direction D3 and the fourth direction D4.

The passivation film 10 is entirely formed on the exposed surface of the Zener diode 11, and a source-side contact hole or first contact hole 2 is formed in a predetermined portion over a top surface of the first semiconductor region 1B inside the passivation film 10 of the third region R3. Further, a gate-side contact hole or second contact hole 4 is formed in a predetermined portion over a top surface of the fifth semiconductor region 1A inside the passivation film 10 of the third region R3. In addition, the gate electrode 6, more specifically the peripheral part 6A of the gate electrode 6, is so formed on top and side surfaces of the passivation film 10 on the top surface of the fifth semiconductor region 1A, as to fill the gate-side contact hole 4. By filling the gate-side contact hole 4, the fifth semiconductor region 1A of the Zener diode 11 is electrically connected to the central part 6C of the wire-bonding-target gate electrode 6 in the gate pad 18. Further, as shown in FIG. 2, the source electrode 5 is so formed on the top and side surfaces of the passivation film 10 on the top surface of the first semiconductor region 1B, as to fill the source-side contact hole 2. By filling the source-side contact hole 2, the first semiconductor region 1B of the Zener diode 11 is electrically connected to the source region 15 of each MOSFET 14 in the unit cell portion UCP through the source electrode 5.

Electrical connection between the doped polysilicon layer 13 of each MOSFET 14 in the first region R1 or the unit cell portion UCP and the protrusion 6P of the gate electrode 6 is achieved as shown in FIG. 3. Specifically, the peripheral part 6A of the gate electrode 6 and the protrusion 6P connected to the part 6A are formed on the top and side surfaces of the passivation film 10, across the third region R3 and the first region R1, and the peripheral part 6A fills the gate-side contact hole 4 and the protrusion 6P fills a third contact hole or gate electrode layer contact hole 4H provided in part of the passivation film 10 located in a top surface of the doped polysilicon layer 13 on the gate insulating film 7G. With this interconnection structure, the doped polysilicon layer or gate electrode layer 13 of each MOSFET 14 is electrically connected to the central part 6C of the wire-bonding-target gate electrode 6 in the gate pad 18 through the protrusion 6P and the peripheral part 6A. Such protrusions 6P are formed in the peripheral part 6A extending throughout the first to fourth directions D1 to D4 at constant intervals.

Figure 6:
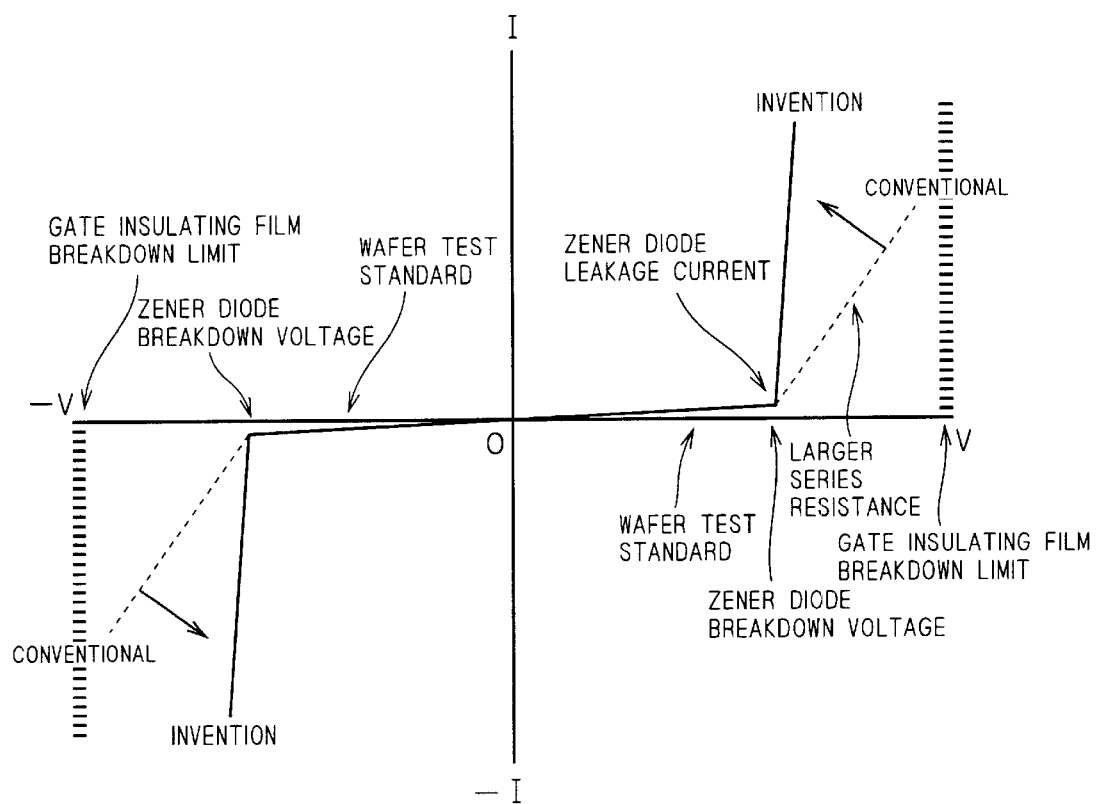
FIG. 6 is a diagram showing the current-voltage characteristic in the Zener-diode-containing power semiconductor devices of the preferred embodiments.
Figure 25:
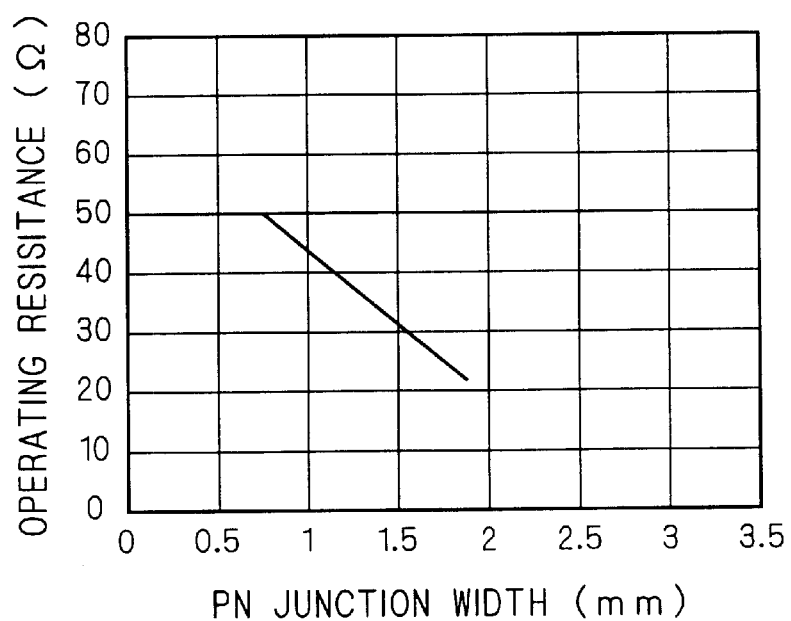
FIG. 25 is a diagram showing a relation between a PN junction width and the operating resistance, which plots mean values of the measurements.
Figure 26:
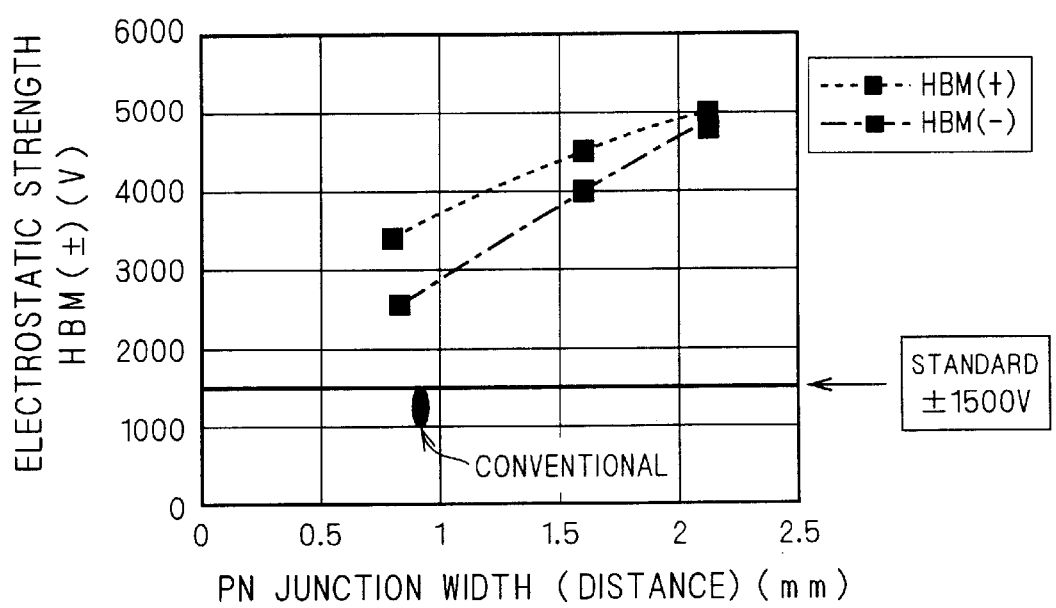
FIG. 26 is a diagram showing the relation between the PN junction width and the electrostatic strength, which plots mean values of the measurements.

As described above, since the Zener diode 11 in accordance with the first preferred embodiment, which is provided in the peripheral part of the chip or in the peripheral part of the unit cell portion UCP, has the above-described frame-like multi-layer structure, the junction width JW of the PN junction face, i.e., the peripheral length JW of the junction face extending throughout the first to fourth directions D1 to D4, becomes much larger than the junction width of the PN junction face in the structure where the Zener diode is provided right under the gate pad. For example, when the gate pad has an area of 500 $\mu m^2$ and the substrate 100 has an area of 2 $mm^2$, the junction width JW is about 1.6 mm, which corresponds to about a quarter of the peripheral length of the substrate 100, 6 mm (=1 mm+2 mm+1 mm+2 mm). Consequently, the operating resistance of the Zener diode 11 in accordance with the first preferred embodiment becomes about 30 $\Omega$, as can be seen from FIG. 25, and a withstand voltage in this case is about 4000 V as shown in FIG. 5, which fully satisfies the original target withstand voltage (=1500 V). The I–V characteristic of the Zener diode 11 of the first preferred embodiment, as shown by a solid line in FIG. 6, is remarkably improved as compared with that of the background art (shown by a broken line in FIG. 6). This makes it possible to realize products which are sufficiently resistant to noises such as static electricity and can fully utilize the input protecting function. Further, it is also possible to prevent the leakage current by controlling the impurity concentration in the P type layers or N+ layers in the Zener diode 11.

The reference numeral 12 in FIGS. 2 to 4 denotes a drain electrode.

Figure 7:
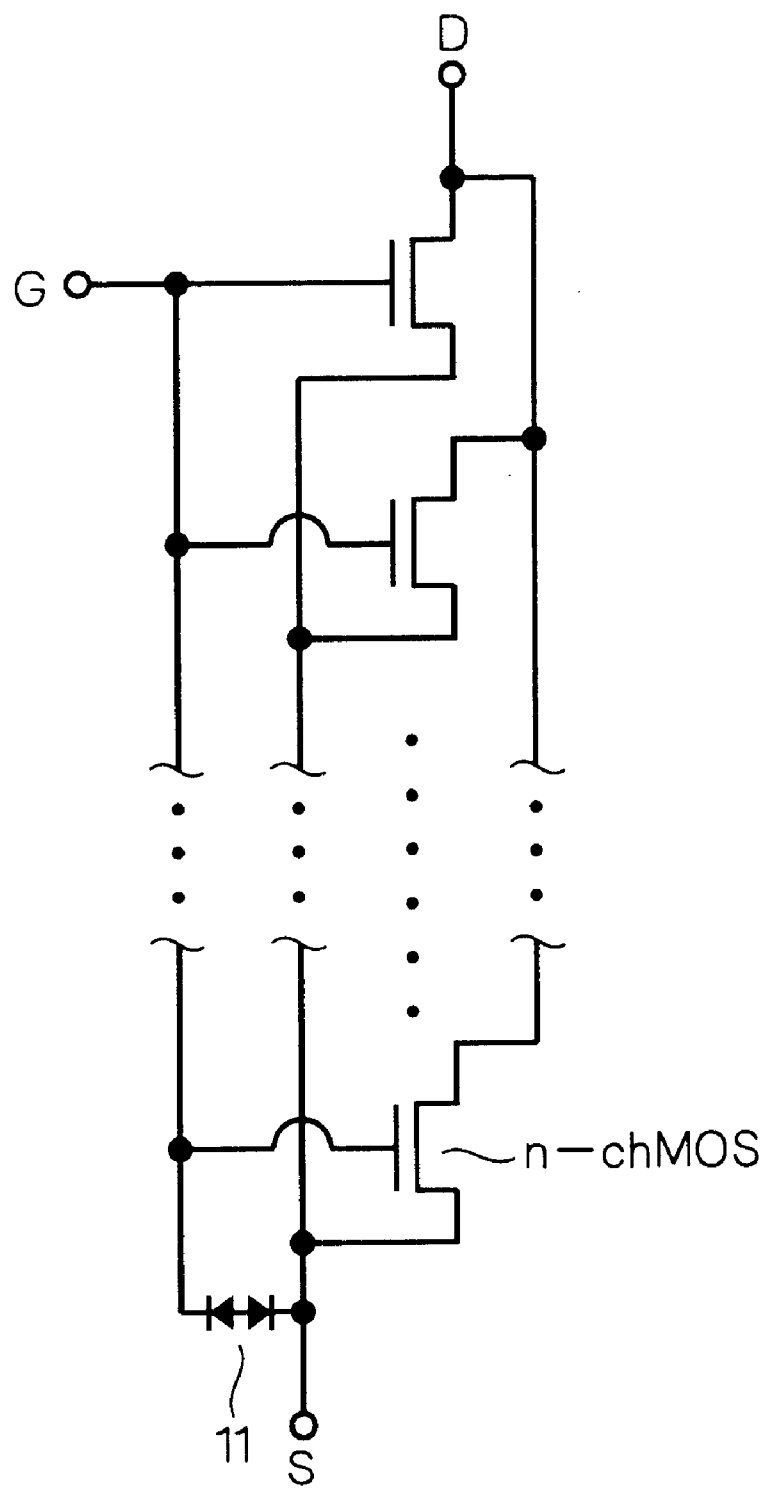
FIG. 7 is a diagram showing an equivalent circuit of the Zener-diode-containing power semiconductor device in accordance with the first preferred embodiment.

FIG. 7 shows an equivalent circuit of this power semiconductor device.

Further, though the second contact hole 4 is used as the gate-side contact hole and the first contact hole 2 is used as the source-side contact hole in the example above, the interconnection with converse structure can be established without any problem.

(Second Preferred Embodiment)

Figure 8:
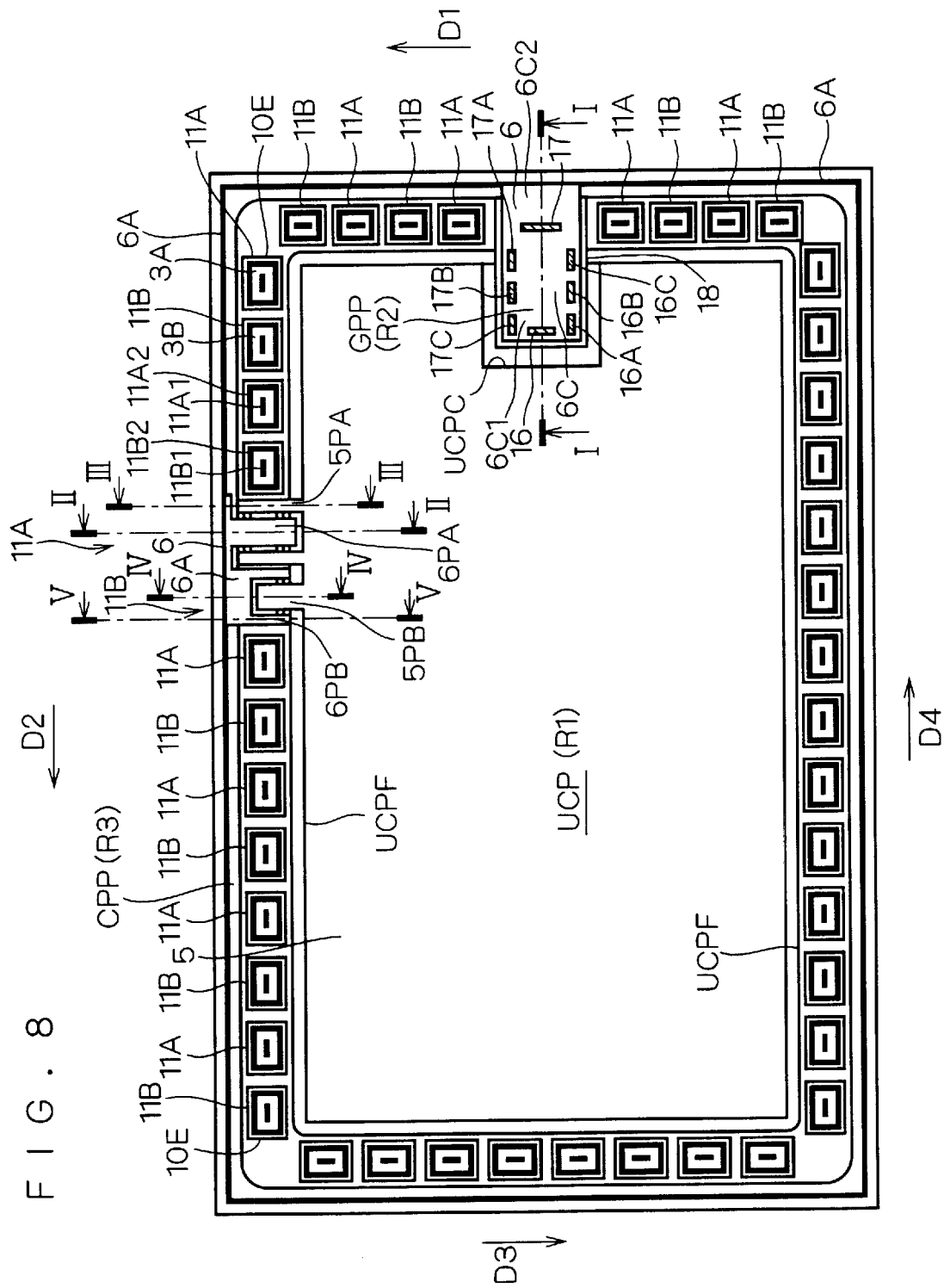
FIG. 8 is a plan view showing a structure of a Zener-diode-containing power semiconductor device in accordance with a second preferred embodiment.

FIG. 8 is a plan view showing a structure of a Zener-diode-containing power semiconductor device in accordance with the second preferred embodiment. FIGS. 9, 10, 11, 12 and 13 are the vertical sections taken along lines I—I, II—II, III—III IV—IV and V—V shown in FIG. 8, respectively. FIG. 14 is a diagram showing an equivalent circuit of the Zener-diode-containing power semiconductor device of the second preferred embodiment. The structure of the device, mainly that of the chip periphery portion CPP, will be described below referring to these drawings. While FIG. 8 only shows, for the sake of simplicity of the drawing, a first protrusion 6PA of the gate electrode 6 and a first protrusions 5PA of the source electrode 5 on one arbitrary first Zener diode 11A, the protrusions 6PA and 5PA are formed for each of all the first Zener diodes 11A. While FIG. 8 also only shows a second protrusions 6PB of the gate electrode 6 and a second protrusion 5PB of the source electrode 5 on one arbitrary second Zener diode 11B for simplicity of illustration, the protrusions 6PB and 5PB are formed for each of all the second Zener diodes 11B.

The power semiconductor device which contains Zener diodes of the second preferred embodiment is characterized in that the first Zener diodes 11A and the second Zener diodes 11B in which their gate-side contact regions and source-side contact regions are arranged in opposite manners are alternately disposed in the chip periphery portion CPP at equal intervals. A plurality of trench-type MOSFETs provided in the unit cell portion UCP are generally classified into: (1) a first group consisting of first MOS-structure power semiconductor elements n-chMOS1 each comprising the first Zener diode 11A serving as the input protection circuit, and (2) a second group consisting of second MOS-structure power semiconductor elements n-chMOS2 each comprising the second Zener diode 11B serving as the input protection circuit.

First, referring to FIGS. 8, 10 and 11, the structure of the first Zener diodes 11A will be described. Each of the first Zener diodes 11A comprises: (1) a first semiconductor region 11A1 having a first conductivity type ($N^+$ type in this example) and located in the center; (2) a second semiconductor region of a second conductivity type (P type in this example) which is so formed, extending along the first direction D1, the second direction D2, the third direction D3 and the fourth direction D4, being in full surface contact with a peripheral surface of the first semiconductor region 11A1, as to completely surround the first semiconductor region 11A1; (3) an $N^+$ type third semiconductor region which is so formed, extending along the first direction D1, the second direction D2, the third direction D3 and the fourth direction D4, being in full surface contact with a peripheral surface of the P type second semiconductor region, as to completely surround the second semiconductor region; (4) a P type fourth semiconductor region which is so formed, extending along the first direction D1, the second direction D2, the third direction D3 and the fourth direction D4, being in full surface contact with a peripheral surface of the $N^+$ type third semiconductor region, as to completely surround the third semiconductor region; and (5) a fifth semiconductor region 11A2 (the outermost n-th semiconductor region (n is five in this example)) of the first conductivity type ($N^+$ type in this example) which is so formed, extending along the first direction D1, the second direction D2, the third direction D3 and the fourth direction D4, being in full surface contact with a peripheral surface of the P type fourth semiconductor region, as to completely surround the fourth semiconductor region. Further, (2) the second semiconductor region, (3) the third semiconductor region and (4) the fourth semiconductor region form a PN junction region 3A.

As described above, each of the first Zener diodes 11A comprises n semiconductor regions (n is an odd number of three or larger) arranged one outside another from the first semiconductor region 11A1 located in the center; the n semiconductor regions have alternating conductivity types and form junctions one surrounding another along the first direction D1, the second direction D2, the third direction D3 and the fourth direction D4.

The passivation film 10 is entirely formed on an exposed surface of each first Zener diode 11A having the above structure ($N^+$-P-$N^+$-P-$N^+$). The reference sign 10E denotes an outer periphery of the passivation film 10.

Figure 10:
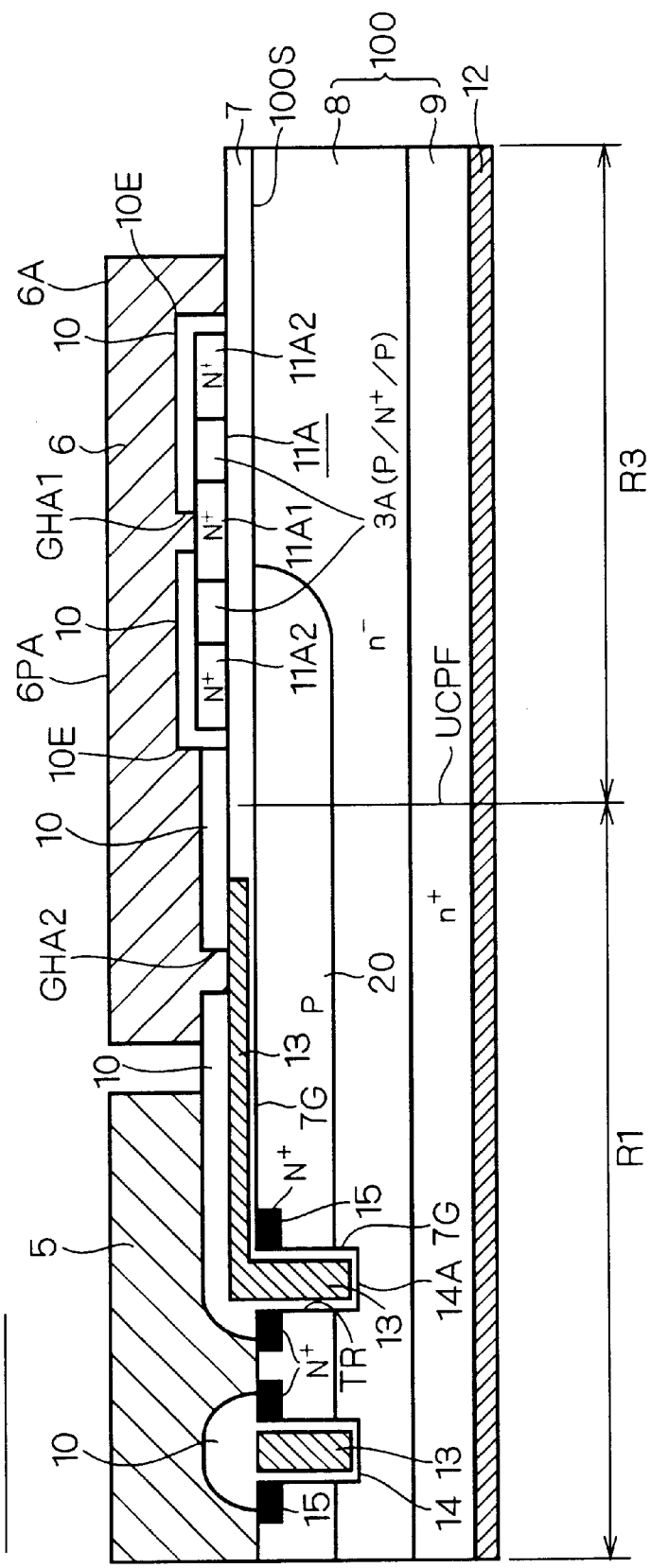

Further, each of the first protrusions 6PA, extending from a portion of the peripheral part 6A of the gate electrode 6 extending throughout the first to fourth directions D1 to D4 corresponding to the position of each first Zener diode 11A toward the outer frame portion UCPF, is formed on the other portion than a portion of the passivation film 10 located on a portion of the outermost fifth semiconductor region 11A2 parallel to the first direction D1, a portion of the outermost fifth semiconductor region 11A2 parallel to the third direction D3 and their vicinities (FIG. 10). Moreover, a first contact hole or gate-side contact hole GHA1 is formed in part of the portion of the passivation film 10 on which the first protrusion 6PA of the gate electrode 6 is formed, which is located over a top surface of the central first semiconductor region 11A1. In addition, a sixth contact hole or gate-side contact hole GHA2 is formed in a predetermined portion of the passivation film 10 located on the top surface of the doped polysilicon layer or first gate electrode layer 13 of a first MOS-structure power semiconductor element 14A (n-chMOS1) extending from the first region R1 to the adjacent third region R3. Both the contact holes GHA1 and GHA2 are filled with the first protrusion 6PA of the gate electrode 6. With this structure, the first semiconductor region 11A1 of each first Zener diode 11A is electrically connected to the wire-bonding-target gate electrode 6 or central part 6C in the gate pad 18 through the first contact hole GHAL, the first protrusion 6PA and the peripheral part 6A, and the first semiconductor region 11A1 is also electrically connected to the first gate electrode layer 13 of the corresponding first MOS-structure power semiconductor element 14A in the unit cell portion UCP through both the contact holes GHA1 and GHA2.

Figure 11:
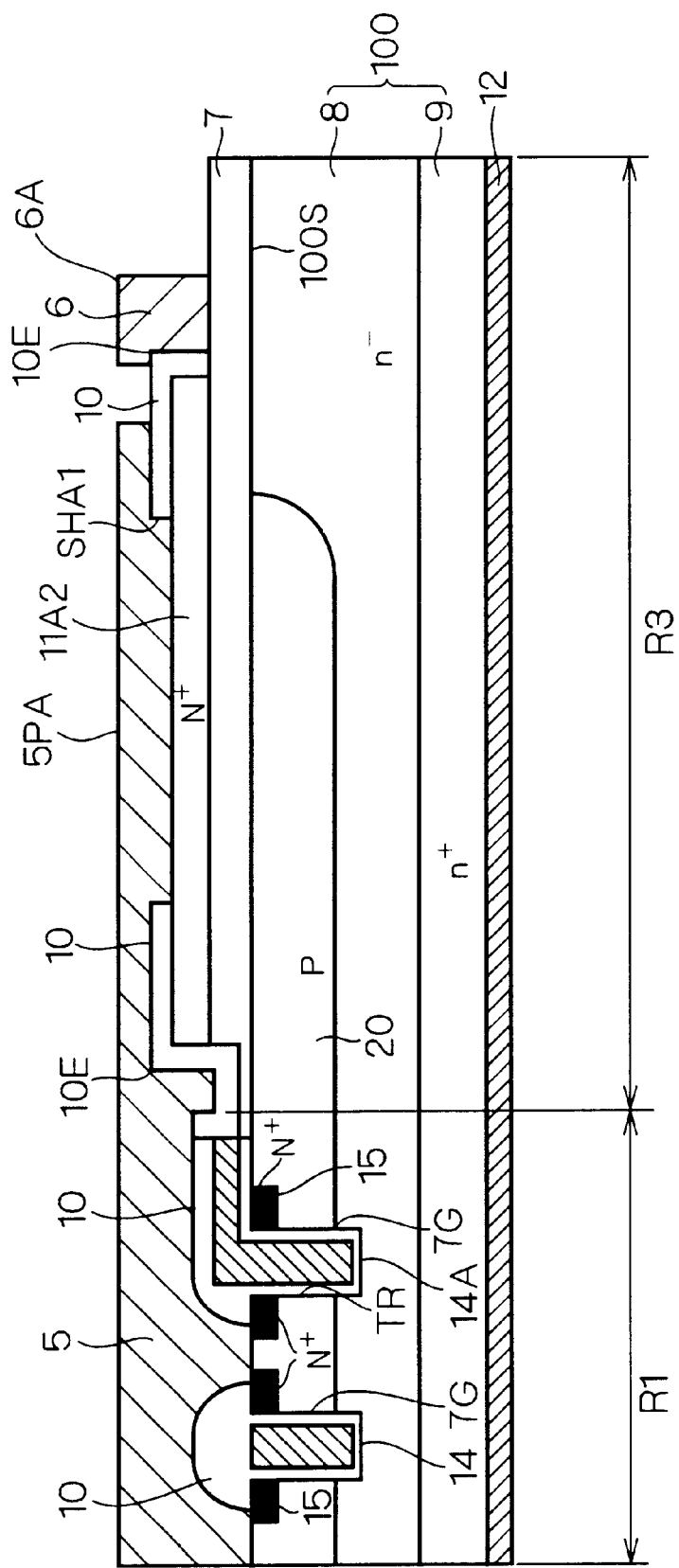

Furthermore, the two first protrusions 5PA of the source electrode 5, each extending from a portion opposed to the first Zener diodes 11A in the periphery of the source electrode 5 of the unit cell portion UCP toward the peripheral part 6A of the gate electrode 6, are formed, one on a portion of the passivation film 10 located on the portion of the outermost fifth semiconductor region 11A2 parallel to the first direction D1 (and its vicinity) and the other on a portion of the passivation film 10 located on the portion of the outermost fifth semiconductor region 11A2 parallel to the third direction D3 (and its vicinity) (FIG. 11). Moreover, a second contact hole SHA1 which exposes a top surface of the fifth semiconductor region 11A2 is formed in a predetermined portion of the passivation film 10 located on the portion of the fifth semiconductor region 11A2 parallel to the first direction D1 (and its vicinity). Similarly, though not shown in the drawings, the second contact hole SHA1 is also formed in a predetermined portion of the passivation film 10 located on the portion of the fifth semiconductor region 11A2 parallel to the third direction D3 (and its vicinity). With this structure and interconnection, the outermost fifth semiconductor region 11A2 is electrically connected to one main electrode layer of the first MOS-structure power semiconductor element 14A in the unit cell portion UCP, i.e., the source region 15 in the P base region 20 through the two second contact holes SHAL and two first protrusions 5PA.

Next, referring to FIGS. 8, 12 and 13, the structure of the second Zener diodes 11B will be described. Each of the second Zener diodes 11B comprises: (1) a first semiconductor region 11B1 having a first conductivity type ($N^+$ type in this example) and located in the center; (2) a second semiconductor region of a second conductivity type (P type in this example) which is so formed, extending along the first direction D1, the second direction D2, the third direction D3 and the fourth direction D4, being in full surface contact with a peripheral surface of the first semiconductor region 11B1, as to completely surround the first semiconductor region 11B1; (3) an $N^+$ type third semiconductor region which is so formed, extending along the first direction D1, the second direction D2, the third direction D3 and the fourth direction D4, being in full surface contact with a peripheral surface of the P type second semiconductor region, as to completely surround the second semiconductor region; (4) a P type fourth semiconductor region which is so formed, extending along the first direction D1, the second direction D2, the third direction D3 and the fourth direction D4, being in full surface contact with a peripheral surface of the $N^+$ type third semiconductor region, as to completely surround the third semiconductor region; and (5) a fifth semiconductor region 11B2 (the outermost n-th semiconductor region (n is five in this example)) of the first conductivity type ($N^+$ type in this example) which is so formed, extending along the first direction D1, the second direction D2, the third direction D3 and the fourth direction D4, being in full surface contact with a peripheral surface of the P type fourth semiconductor region, as to completely surround the fourth semiconductor region. Further, (2) the second semiconductor region, (3) the third semiconductor region, and (4) the fourth semiconductor region form a PN junction region 3B.

As described above, each of the second Zener diodes 11B has n semiconductor regions (n is an odd number of three or larger) arranged one outside another from the first semiconductor region 11B1 located in the center; the n semiconductor regions have alternating conductivity types and make junctions one surrounding another along the first direction D1, the second direction D2, the third direction D3 and the fourth direction D4.

The passivation film 10 is entirely formed on an exposed surface of each second Zener diode 11B having the above structure ($N^+$-P-$N^+$-P-$N^+$).

Figure 12:
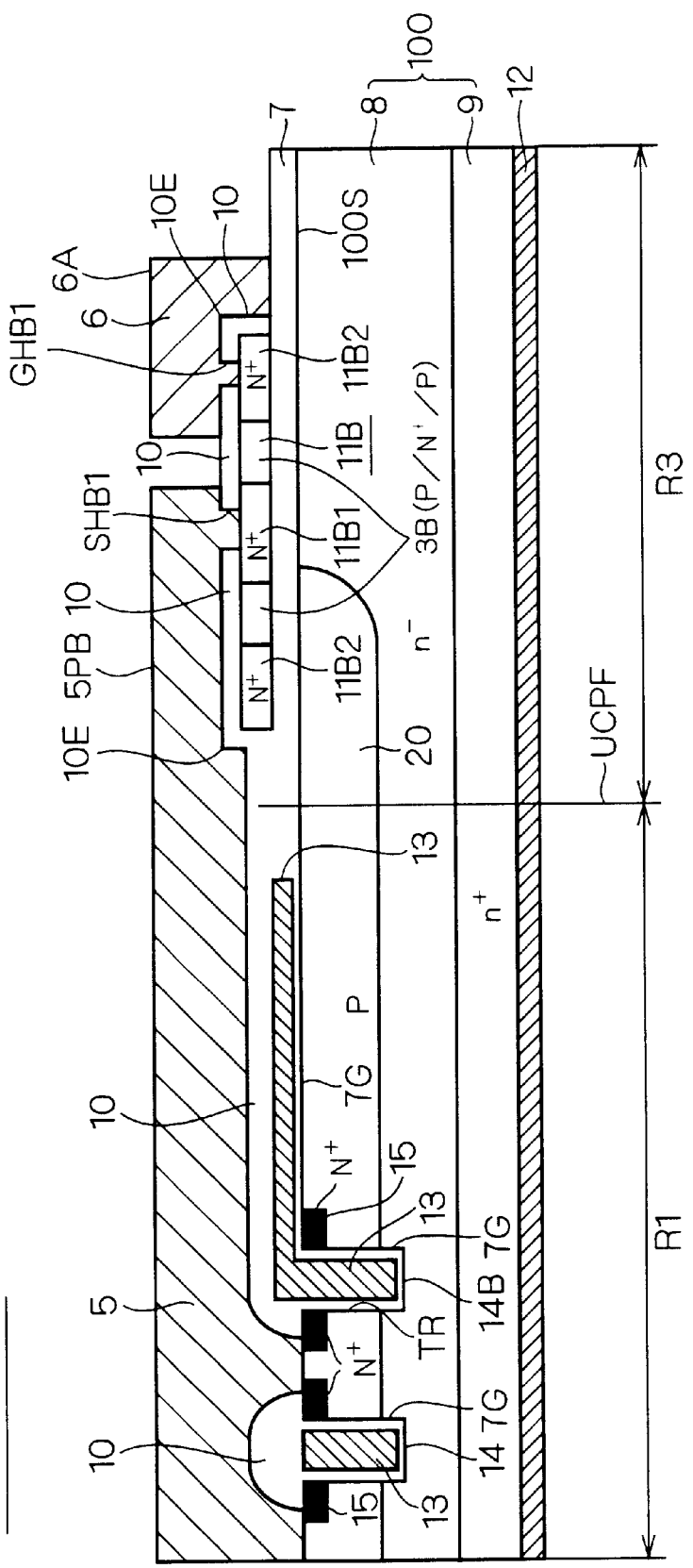

Further, the second protrusion 5PB of the source electrode 5 extending from a portion of the periphery of the source electrode 5 of the unit cell portion UCP opposed to each of the second Zener diodes 11B toward the peripheral part 6A of the gate electrode 6 is formed on the other portion than a portion of the passivation film 10 located on a portion of the outermost fifth semiconductor region 11B2 parallel to the first direction D1, a portion of the outermost fifth semiconductor region 11B2 parallel to the third direction D3 and their vicinities (FIG. 12). Moreover a fourth contact hole or source-side contact hole SHB1 is formed in part of the portion of the passivation film 10 on which the second protrusion 5PB of the source electrode 5 is formed, which is located over a top surface of the central first semiconductor region 11B1. In addition, a gate-side contact hole GHB1 is also formed on a predetermined portion of the passivation film 10 on a top surface of a portion of the fifth semiconductor region 11B2 parallel to the second direction D2, and the gate-side contact hole GHB1 is filled with the peripheral part 6A of the gate electrode 6. As a result, the fifth semiconductor region 11B2 is electrically connected to the peripheral part 6A of the gate electrode 6. The fourth contact hole SHB1 is filled with the second protrusion 5PB of the source electrode 5. With this structure, the first semiconductor region 11B1 of each second Zener diode 11B is electrically connected to one main electrode layer of the second MOS-structure power semiconductor element 14B in the unit cell portion UCP, i.e., the source region 15 in the P base region 20 through the fourth contact hole SHB1 and the second protrusion 5PB.

Figure 13:
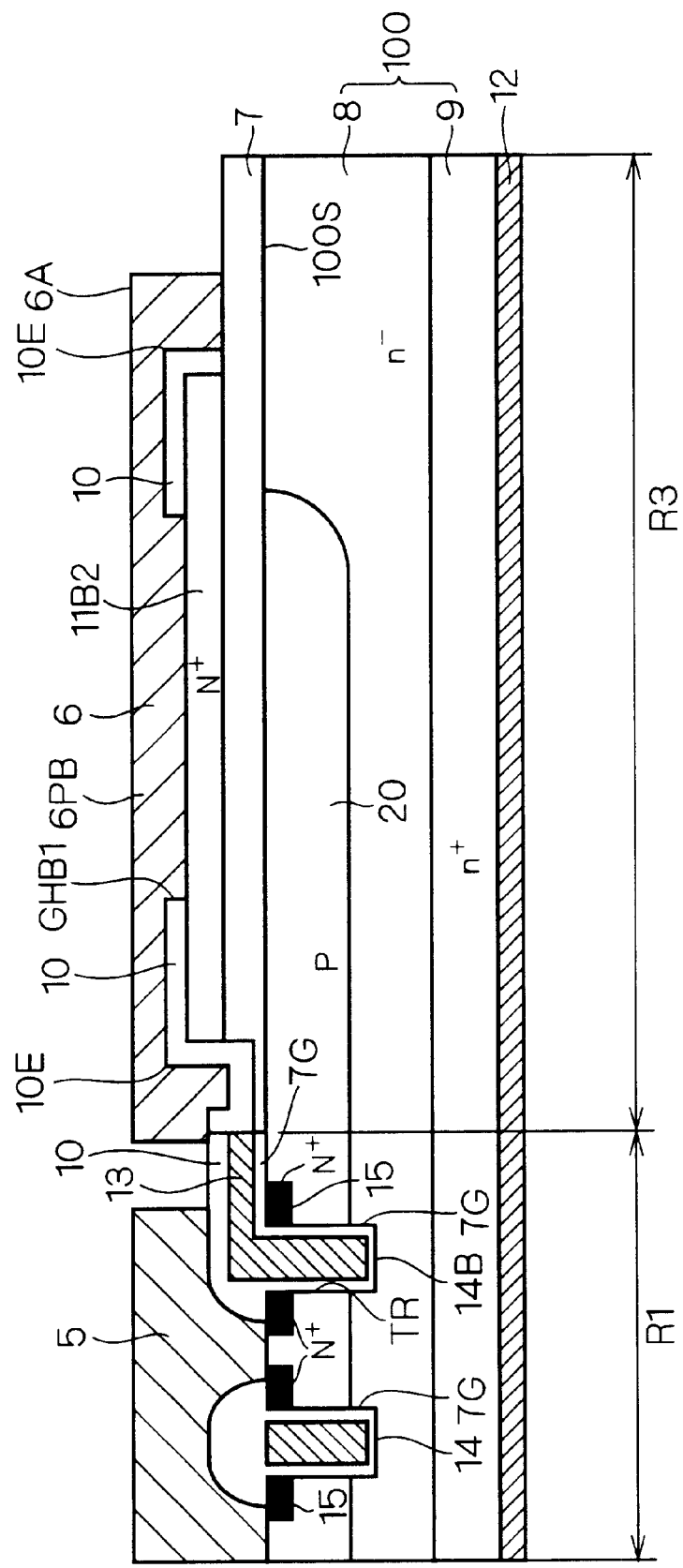
Figure 14:
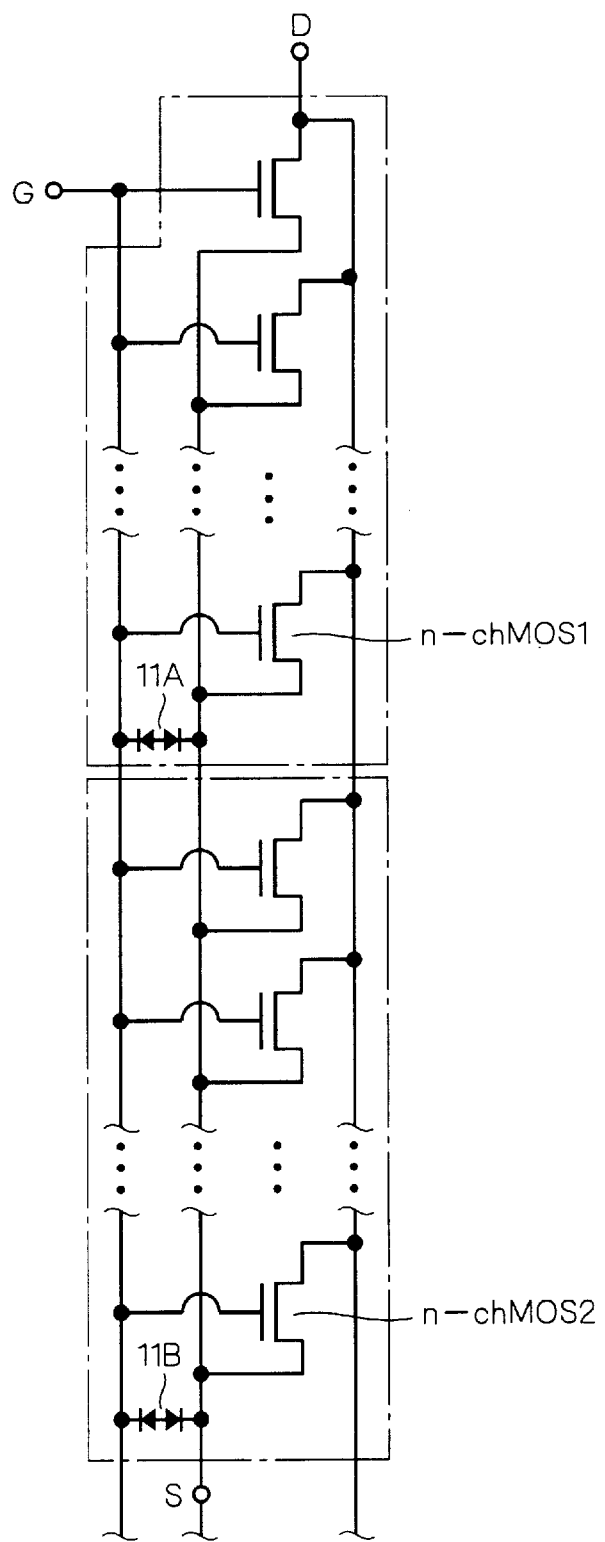
FIG. 14 is a diagram showing an equivalent circuit of the Zener-diode-containing power semiconductor device in accordance with the second preferred embodiment.

Furthermore, the two second protrusions 6PB of the gate electrode 6, each extending from a portion of the peripheral part 6A of the gate electrode 6 opposed to the second Zener diodes 11B toward the outer frame portion UCPF of the unit cell portion UCP, are formed, one on a portion of the passivation film 10 located on the portion of the outermost fifth semiconductor region 11B2 parallel to the first direction D1 (and its vicinity) and the other on a portion of the passivation film 10 located on the portion of the outermost fifth semiconductor region 11B2 parallel to the third direction D3 (and its vicinity) (FIG. 13). Moreover, a third contact hole or gate-side contact hole GHB1 which exposes a top surface of the fifth semiconductor region 11B2 is formed in a predetermined portion of the passivation film 10 located on the portion of the fifth semiconductor region 11B2 parallel to the first direction D1 (and its vicinity). Similarly, though not shown in the drawings, the third contact hole GHB1 is also formed in a predetermined portion of the passivation film 10 located on the portion of the fifth semiconductor region 11B2 parallel to the third direction D3 (and its vicinity). Furthermore, the third contact hole GHB1 is connected to the gate-side contact hole GHB1 shown in FIG. 12. With this structure and interconnection, the outermost fifth semiconductor region 11B2 is electrically connected to the wire-bonding-target gate electrode 6 or central part 6C of the gate pad 18 through the third contact holes GHB1, the second protrusion 6PB and the peripheral part 6A. Further, the fifth semiconductor region 11B2 of each second Zener diode 11B is not directly connected electrically to the second gate electrode layer 13 of the corresponding second MOS-structure power semiconductor element 14B formed in the unit cell portion UCP (see FIG. 13). In this case, since the second gate electrode layer 13 of the second MOS-structure power semiconductor element 14B is electrically connected to the first gate electrode layer 13 of the first MOS-structure power semiconductor element 14A in the unit cell portion UCP (not shown), the second gate electrode layer 13 of the second MOS-structure power semiconductor element 14B is electrically connected indirectly to the wire-bonding-target gate electrode 6 or central part 6C through the contact hole GHA2 and the parts 6PA and 6A of the first Zener diode 11A.

Figure 9:
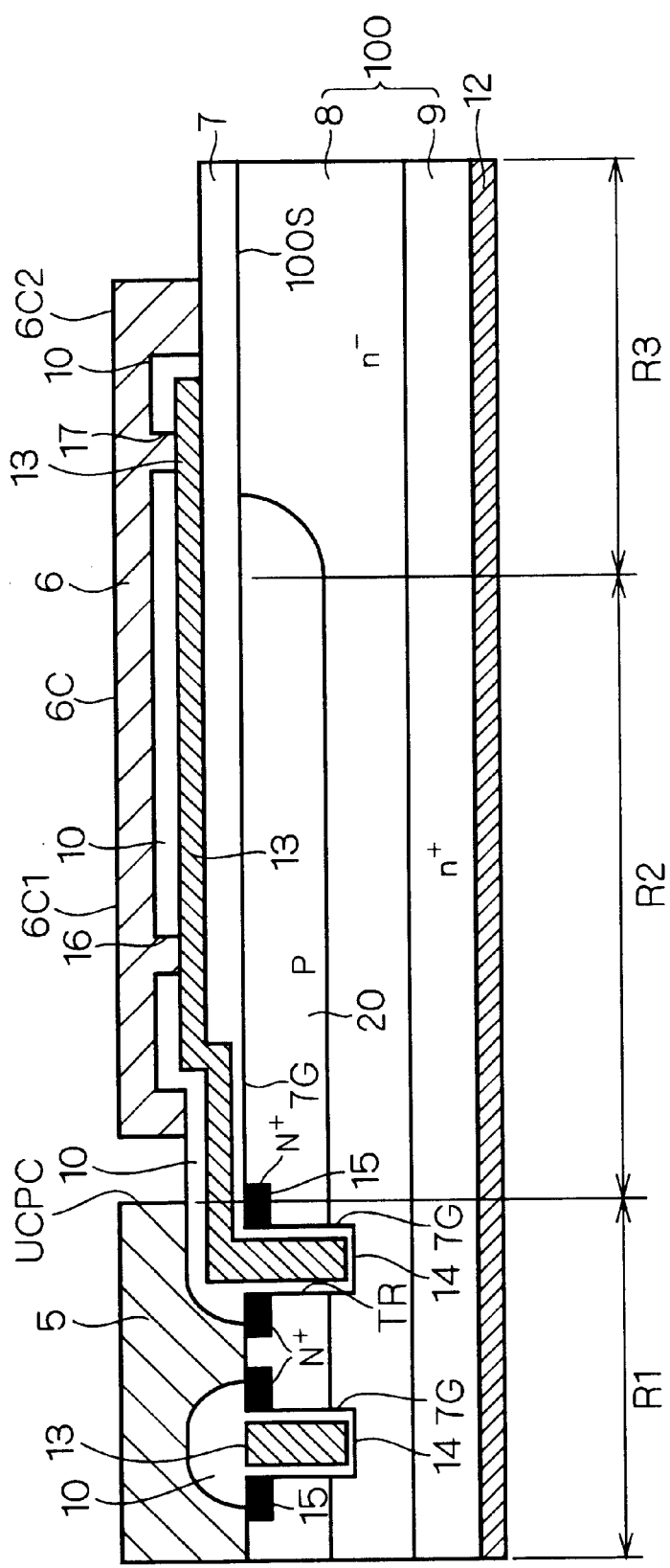
FIGS. 9 to 13 are vertical sections showing the structure of the Zener-diode-containing power semiconductor device in accordance with the second preferred embodiment.

While the first and third regions R1 and R3 are constructed as described above, the gate pad portion GPP on the second region R2, shown in FIG. 9, is constructed in basically the same way as that of the first preferred embodiment. In the second preferred embodiment, however, the Zener diodes are not formed at all on the main surface 100S right under the second part 6C2 of the central part 6C of the gate electrode 6, and the doped polysilicon layer 13 is extended into the third region R3 right under the second part 6C2 and electrically connected to the first part 6C1 and the second part 6C2 of the central part 6C through the contact holes 16 and 17 formed right under the gate electrode. The reference signs 16A, 16B, 16C, 17A, 17B and 17C shown in FIG. 8 also denote right-under-gate-electrode contact holes for making electrical connection between the doped polysilicon layer 13 and the central part 6C of the gate electrode 6.

With the above-described structure and interconnections, the following effects or advantages can be produced.

(i) The gate pad 18 can be easily small-sized since the Zener diodes are disposed in the chip periphery portion CPP on the periphery side of the substrate 100, which is located in the periphery of the unit cell portion UCP and the periphery of the gate pad portion GPP. This allows larger effective area for the effective cell region to certainly achieve lower on-state resistance and lower on-state voltage of the power MOS-structure semiconductor elements 14 in the unit cell portion UCP.

(ii) In the second preferred embodiment, the plurality of Zener diodes including the plurality of first Zener diodes 11A and the plurality of second Zener diodes 11B are disposed in the chip periphery portion CPP. Therefore, the PN junction width can be easily made further larger than that in the first preferred embodiment in which one Zener diode is disposed in the chip periphery portion CPP. For example, when Zener diodes each having both length and width dimensions of 60 $\mu$m are provided in the chip periphery portion CPP of a chip having a length (shorter) dimension of 1 mm and a width (longer) dimension of 2 mm, the PN junction width of the Zener diodes, which corresponds to the sum total of the PN junction widths of the Zener diodes 11A and 11B, is as large as about 20 mm. This value is twelve times larger than the exemplary PN junction width, 1.6 mm, obtained in the first preferred embodiment. This offers an extremely large electrostatic strength (V) far beyond the standard value described before. In this case, the current-voltage characteristic exhibits a very steep breakdown voltage characteristic as shown by the solid line in FIG. 6. Thus, it is easily possible to obtain very large electrostatic strength with the operating resistance of the Zener diodes set sufficiently smaller than 30 Ω, so that the gate insulating film can be fully protected from noises such as static electricity.

Moreover, it is possible to freely set the sum total of the number of the first Zener diodes 1A and the number of the second Zener diodes 1B. This means that the PN junction width can be easily adjusted through the sum total. The PN junction width can thus be adjusted in a wider range, so that the operating resistance of the Zener diodes can be easily and freely controlled.

(iii) The greatest advantage of the second preferred embodiment is that the current-voltage (I–V) characteristic of the Zener diodes can provide perfectly symmetrical bidirectionality about the origin of the current and voltage axes, so that the stress to the gate insulating film can be remarkably stabilized. That is to say, enhancing the input protection function of the Zener diodes (enhancing the Zener diode effect) requires that the area of the gate-side contact holes and the area of the source-side contact holes of the Zener diodes should be set as large as possible. On the other hand, achieving symmetrical bidirectionality of the current-voltage (I–V) characteristic of the Zener diodes requires that the area of the gate-side contact holes of the Zener diodes should be equal to the area of the source-side contact holes thereof. In this respect, the background-art semiconductor device in which the Zener diode is disposed right under the gate pad could not satisfy both of these requirements or conditions. On the other hand, in the second embodiment, since the first Zener diodes 11A and the second Zener diodes 11B are alternately arranged, a first sum total of the sum of the areas of the gate-side contact holes GHA1 of the first Zener diodes 11A (which corresponds to the first areas) and the sum of the areas of the gate-side contact holes GHB1 of the second Zener diodes 11B (which corresponds to the third areas) can be easily set equal to a second sum total of the sum of the areas of the source-side contact holes SHA1 of the first Zener diodes 11A (which corresponds to the second areas) and the sum of the areas of the source-side contact holes SHB1 of the second Zener diodes 11B (which corresponds to the fourth areas) (the first sum total=the second sum total). Moreover, the structure of the second preferred embodiment also succeeds in enhancing the Zener diode effect by making both of the first sum total and the second sum total as large as possible. The structure of the second preferred embodiment thus easily and surely achieves symmetrical bidirectionality of the current-voltage (I–V) characteristic while enhancing the Zener diode effect.

(Variation of the Second Preferred Embodiment)

As stated in the second preferred embodiment, the point is that the condition in which the first sum total and the second sum total are equal to each other is realized in the chip periphery portion CPP. When this condition is satisfied, it is then not essential to alternately arrange the first Zener diodes 11A and the second Zener diodes 11B as shown in FIG. 8. In other words, as long as the condition in which the first sum total and the second sum total are equal is realized in the chip periphery portion CPP, the first Zener diodes 11A and the second Zener diodes 11B may be arbitrarily arranged in the chip periphery portion CPP, and the present invention is not limited to the alternate arrangement at equal intervals as shown in FIG. 8. In short, it works when a large number of first Zener diodes 11A and a large number of second Zener diodes 11B are arranged in the chip periphery portion CPP in predetermined arrangement and order or at random and the above-described first sum total and second sum total are equal to each other.

(Third Preferred Embodiment)

Figure 15:
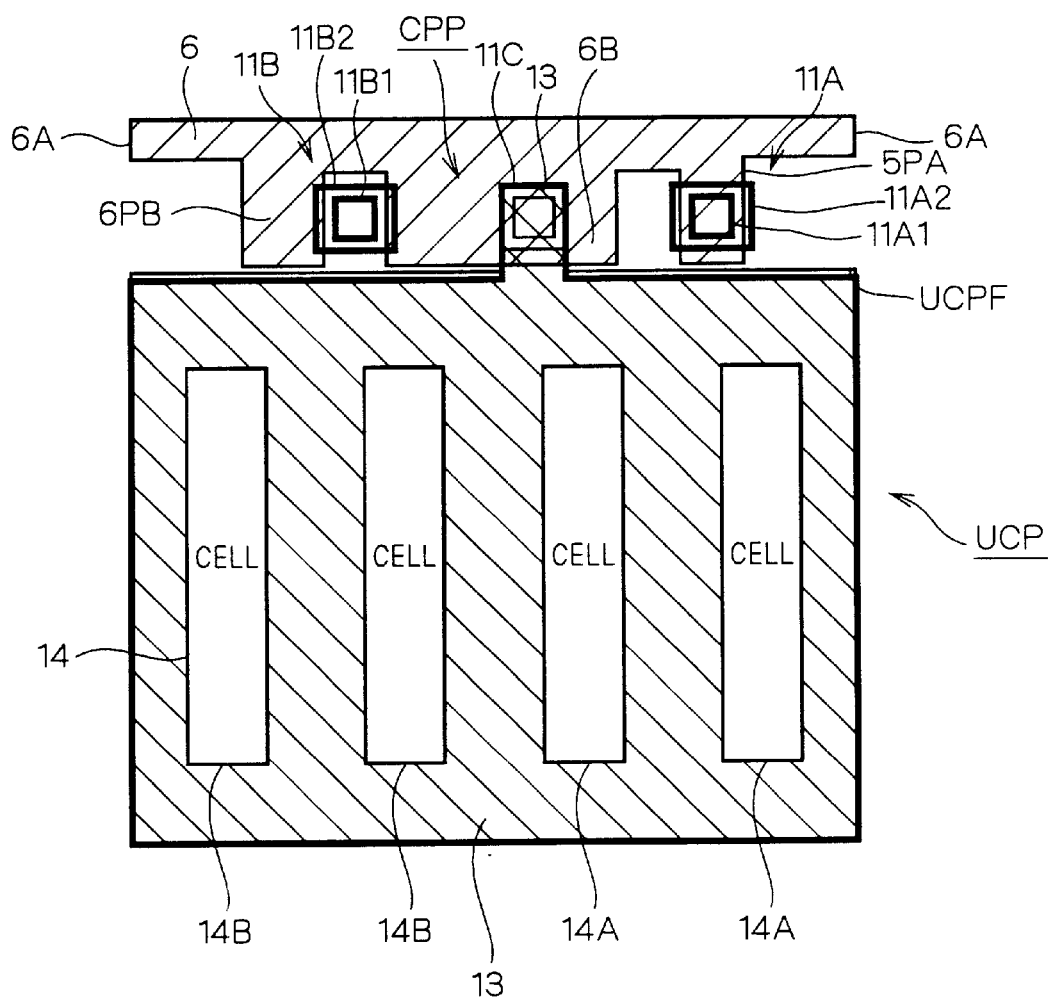
FIG. 15 is a plan view schematically showing a structure of a characteristic part of a Zener-diode-containing power semiconductor device in accordance with a third preferred embodiment.

A third preferred embodiment is an improvement on the second preferred embodiment. Its characteristics can be summarized as follows. As schematically shown in FIG. 15, a common gate electrode layer 6B is provided in a portion of the chip periphery portion CPP located between adjacent first Zener diode 11A and second Zener diode 11B; the common gate electrode layer 6B protrudes from the peripheral part 6A of the gate electrode 6 toward the outer frame portion UCPF. The common gate electrode layer 6B is electrically connected to the doped polysilicon layer 13 which is common to the first MOS-structure power semiconductor elements 14A and the second MOS-structure power semiconductor elements 14B (which is a doped polysilicon layer common to the cells). While each of the first Zener diodes 11A requires the contact hole GHA2 in the second preferred embodiment, this structure and interconnection eliminates this requirement, and the contact between the doped polysilicon layer 13 of each cell 14 and the gate electrode 6 can be made in the chip periphery portion CPP.

Figure 16:
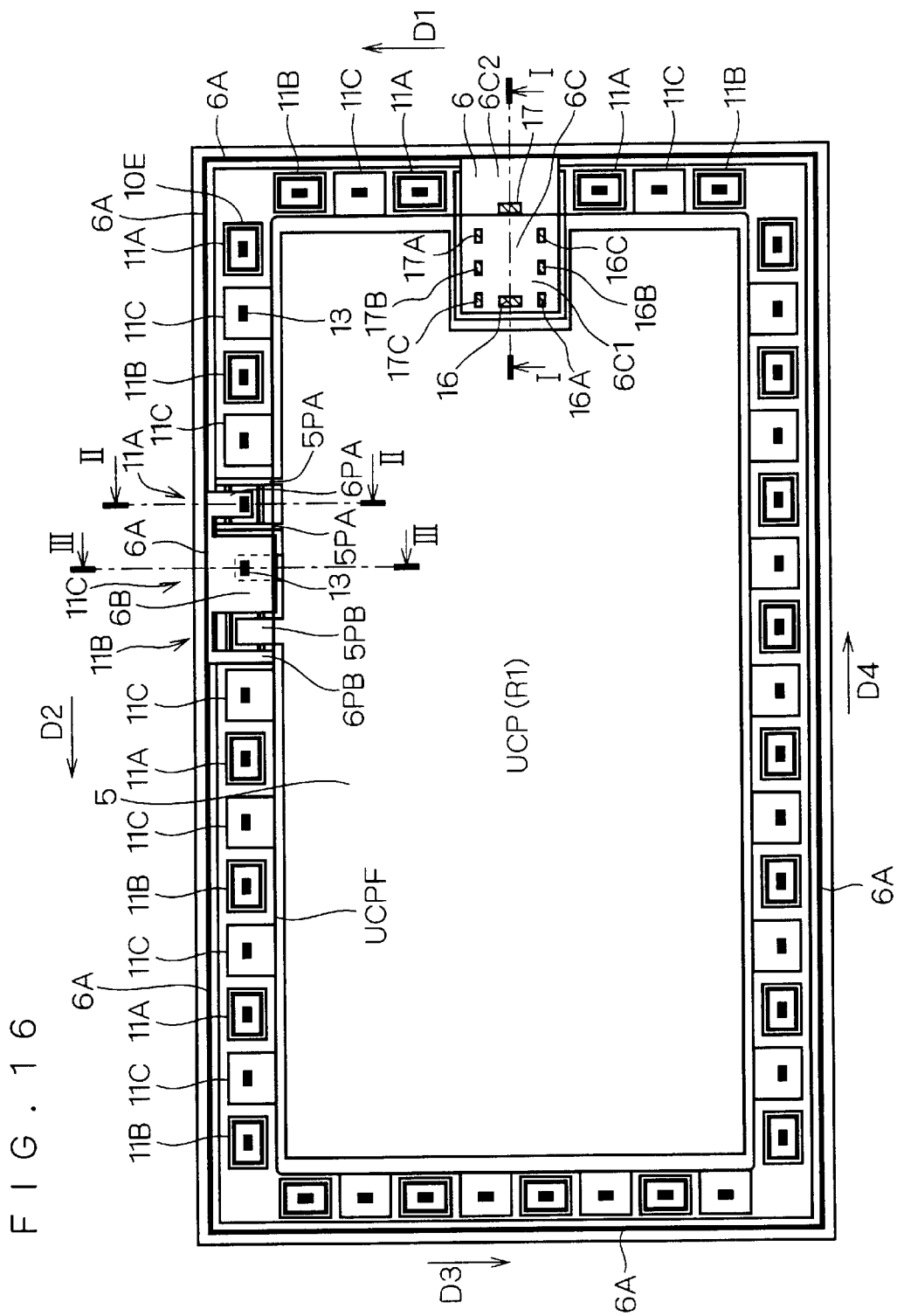
FIG. 16 is a plan view showing an entire structure of the Zener-diode-containing power semiconductor device in accordance with the third preferred embodiment.
Figure 17:
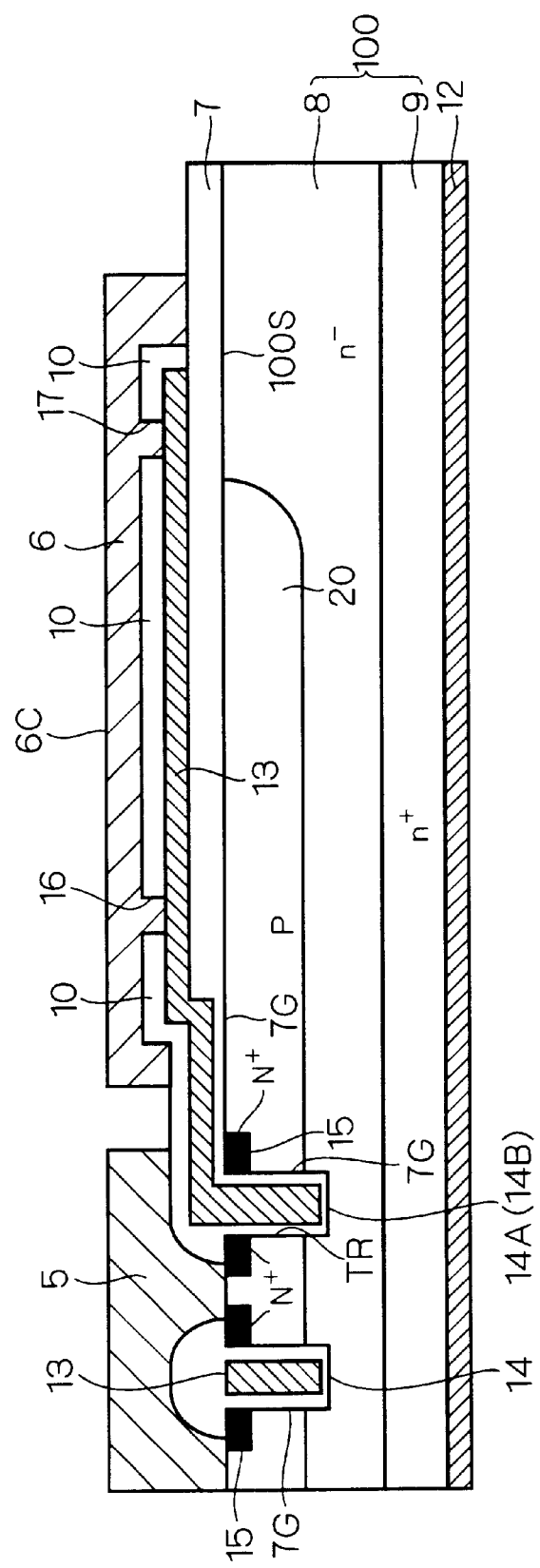
FIGS. 17 to 19 are vertical sections showing the structure of the Zener-diode-containing power semiconductor device in accordance with the third preferred embodiment.
Figure 18:
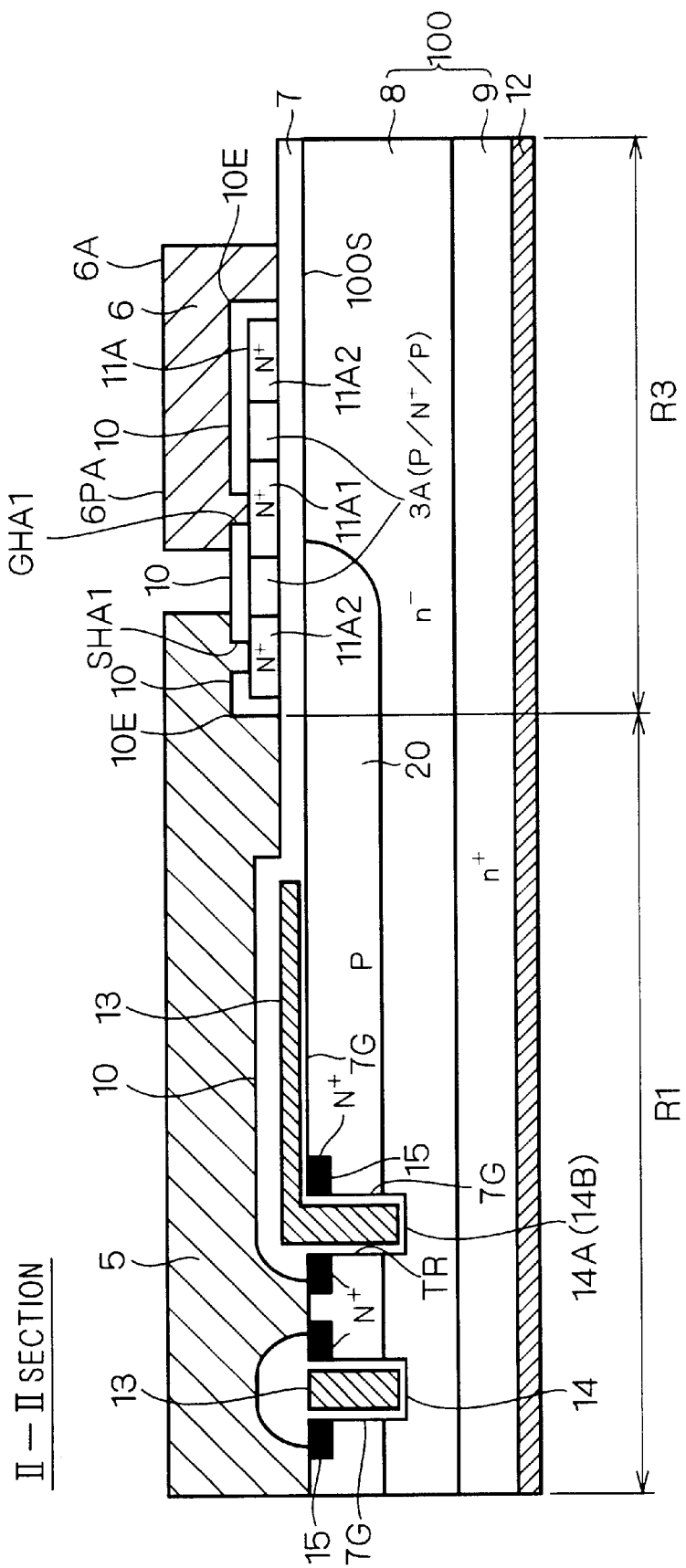
Figure 19:
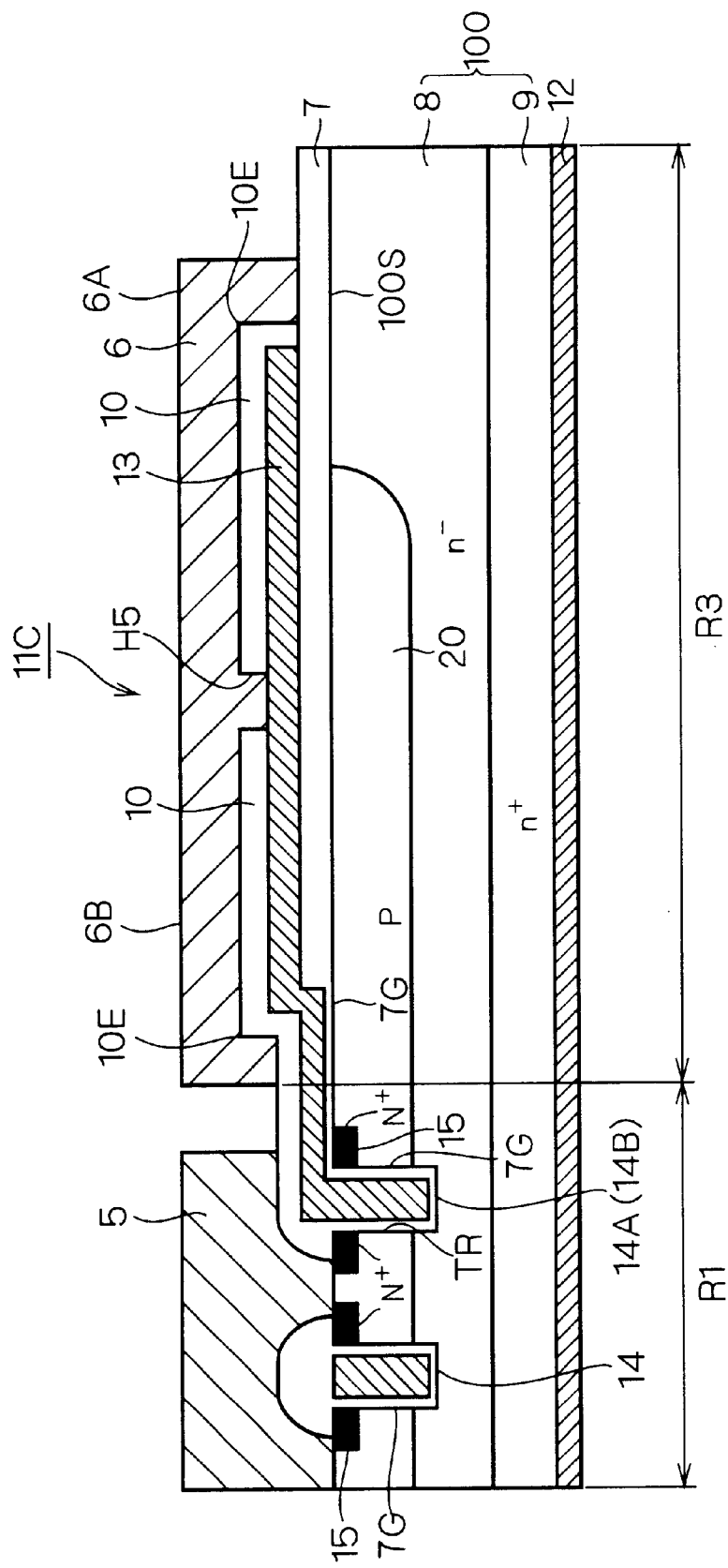
Figure 20:
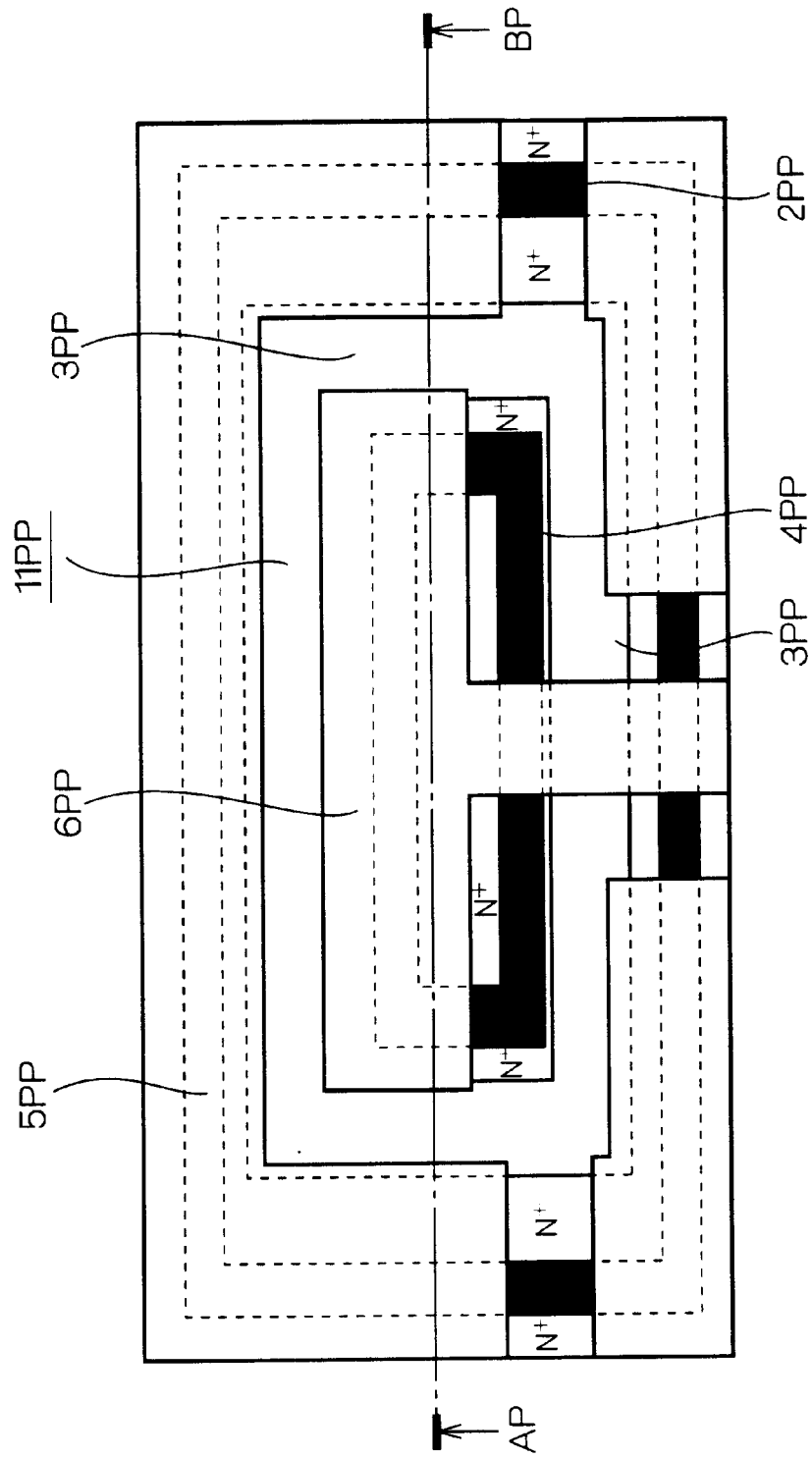
FIG. 20 is a plan view showing a structure of a conventional Zener-diode-containing power semiconductor device.
Figure 21:
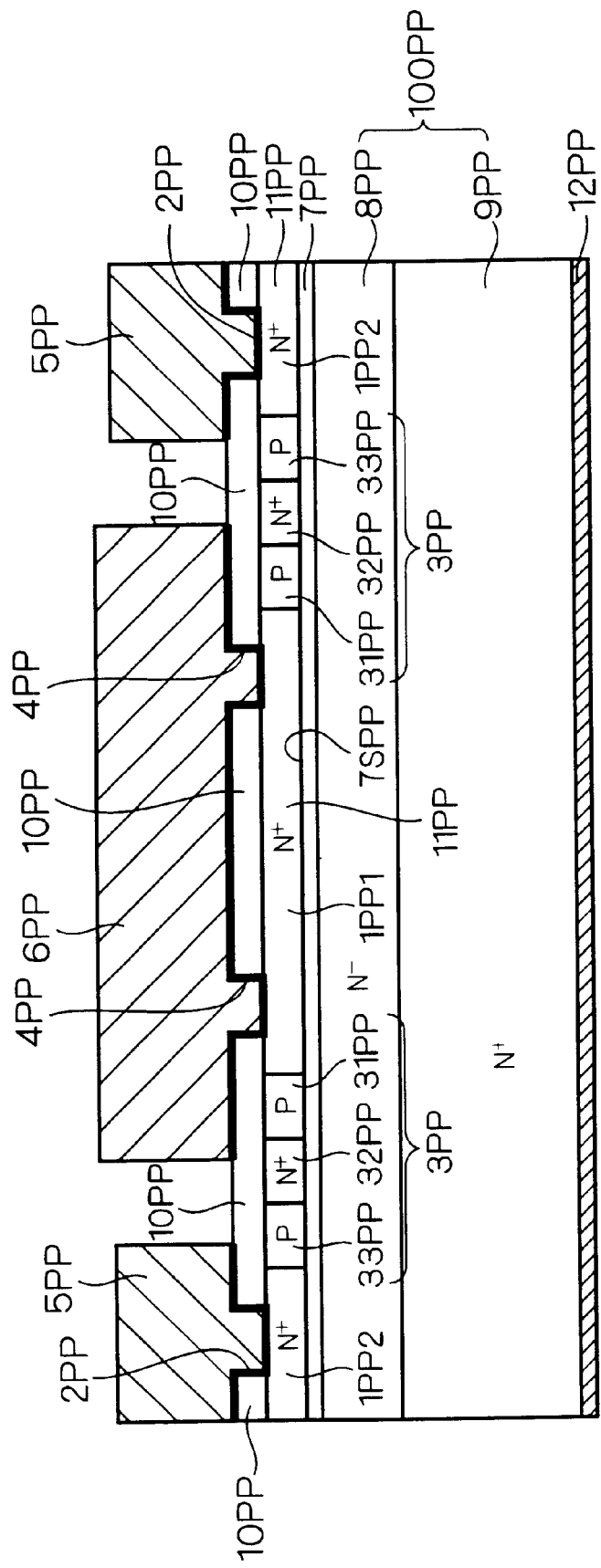
FIG. 21 is a vertical section showing the structure of the conventional Zener-diode-containing power semiconductor device.
Figure 22:
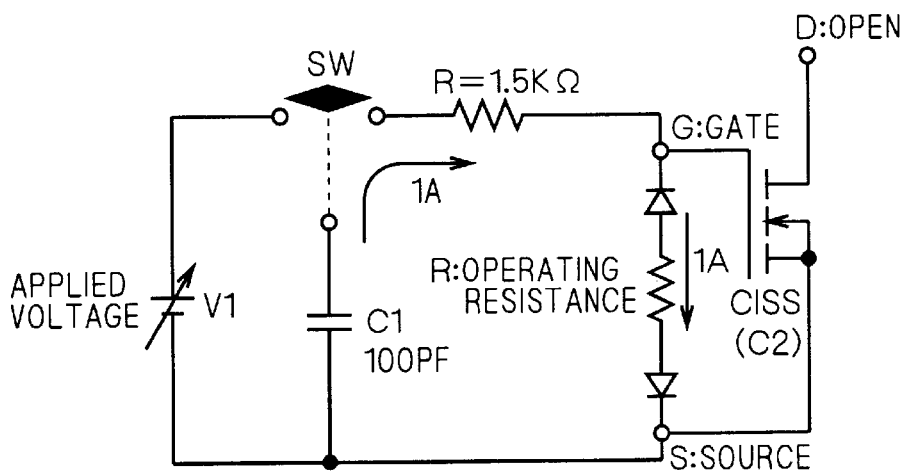
FIG. 22 is a diagram showing an electrostatic strength testing circuit in accordance with HBM method.
Figure 23:
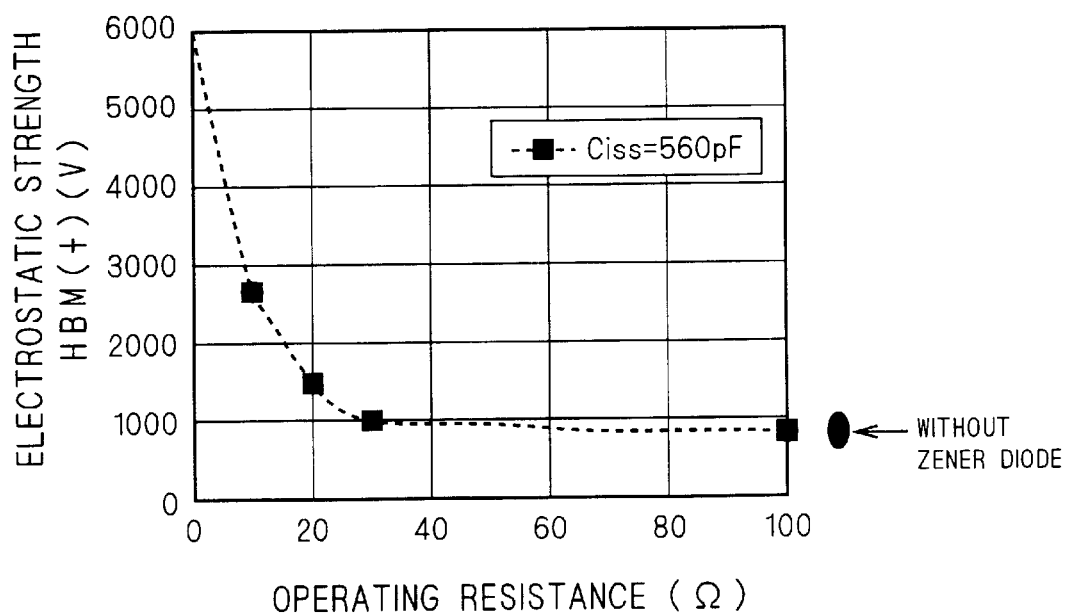
FIG. 23 is a diagram which plots the lowest values of measurements of the electrostatic strength with respect to the operating resistance.
Figure 24:
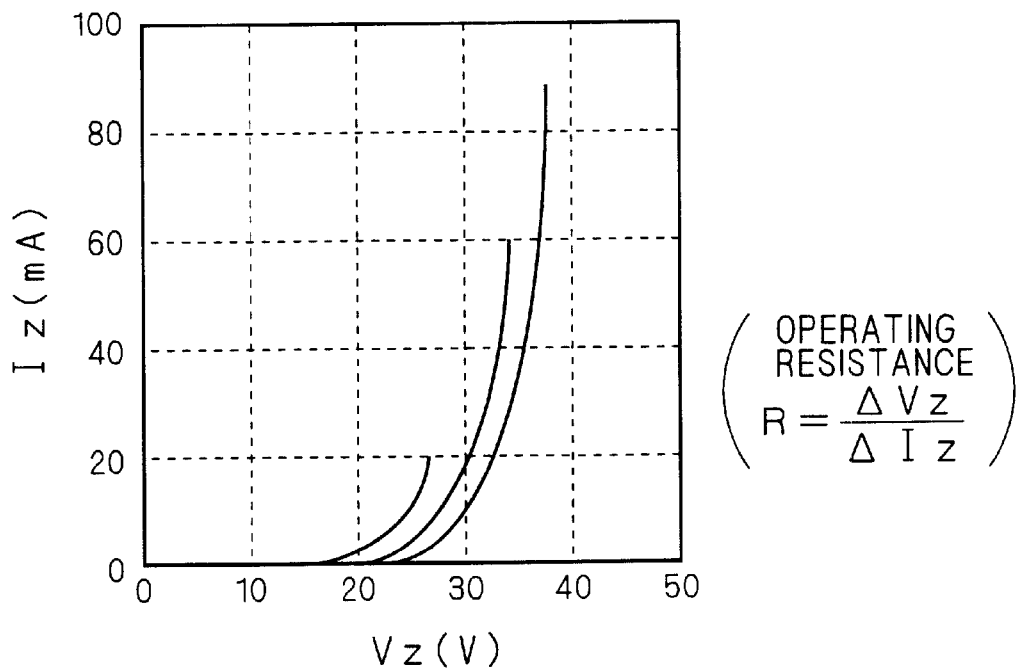
FIG. 24 is a diagram showing measurements of the current-voltage characteristic of a Zener diode with increasing area of the gate pad.

FIG. 16 is a plan view showing a structure of a Zener-diode-containing power semiconductor device in accordance with the third preferred embodiment and FIGS. 17, 18 and 19 are the vertical sections taken along lines I—I, II—II, and III—III shown in FIG. 16, respectively. For simplicity, FIG. 16 only shows the electric connection between the common gate electrode layer 6B and the doped polysilicon layer 13 of each cell in arbitrary one common gate electrode layer formation region 11C, but other common gate electrode layer formation regions 11C have the same structure.

The structure shown in FIG. 17 is the same as that described in the second preferred embodiment and it is therefore not described here again.

As shown in FIGS. 16 and 19, the common gate electrode layer formation region 11C is defined in a portion of the chip periphery portion CPP between adjacent ones of the alternately arranged first Zener diodes 11A and second Zener diodes 11B. This common gate electrode layer formation region 11C is constructed as shown below. Specifically, the insulating film 7 is formed entirely on the main surface 100S in the third region R3, and the doped polysilicon layer 13, which corresponds to the gate electrode layer of the cell 14A or 14B, is extended from the first region R1 on a top surface of the insulating film 7. Further, the passivation film 10 is formed on the top surface of the doped polysilicon layer 13 extending into the third region R3, and the common gate electrode layer 6B is formed on a top surface of the passivation film 10. A fifth contact hole H5 is formed in a predetermined portion of the passivation film 10, and the gate electrode layer 13 of the cell 14A or 14B and the common gate electrode layer 6B of the gate electrode 6 are electrically connected to each other through the fifth contact hole H5. With this electric connection, the longitudinal length of the first protrusion 6PA of the gate electrode 6 provided over the first Zener diode 11A becomes shorter than that in the second preferred embodiment. This is shown in FIG. 18. As shown in FIG. 18, since the longitudinal length of the first protrusion 6PA is shortened, the source-side contact hole SHA1 extending in parallel to the second direction D2 or the fourth direction D4 is formed in a predetermined portion of the passivation film 10, and the fifth semiconductor region 11A2 and the source electrode 5 are electrically connected to each other through the source-side contact hole SHA1.

In this structure, by interposing the common gate electrode layer 6B between the Zener diodes 11A and 11B, each of the first semiconductor region (the region on the gate electrode side) 11A1 of the first Zener diode 11A and the fifth semiconductor region (the region on the gate electrode side) 11B2 of the second Zener diode 11B can be electrically connected to the gate electrode layer 13 of each cell in the unit cell portion UCP at the shortest distance. Therefore, the electric interconnection can thus be much easier and simpler than that in the second preferred embodiment, and the proximate interconnection can further enhance the Zener diode effect.

(Variations)

(1) While the first to third preferred embodiments have shown the Zener diode having the N/P/N/P/N structure (in other words, a structure composed of five semiconductor regions), the Zener diode structure is not limited to this. For example, the Zener diode may be formed with an N/P/N structure (a structure composed of three semiconductor regions), or an N/P/N/P/N/P/N structure (a structure composed of seven semiconductor regions). That is to say, generally, the Zener diode has n (n is an odd number of three or larger) semiconductor regions from the first region located on the side of the periphery of the unit cell portion to the n-th region located on the side of the periphery of the semiconductor substrate, and the n semiconductor regions have alternating conductivity types and form junctions one next to another along the periphery of the semiconductor substrate.

(2) In the first to third preferred embodiments, a transverse section of the semiconductor chip or the Zener-diode-containing power semiconductor device, i.e., a section obtained when the semiconductor chip is cut along a plane parallel to the paper of FIG. 1, is a rectangle, but the transverse section is not limited to this shape and may be a square or a polygon such as a pentagon.

(3) In FIG. 1, the Zener diode in the chip periphery portion CPP does not extend around the outside of the gate pad 18. However, instead, the Zener diode may be extended around the outside of the gate pad 18. That is to say, in FIG. 1, the N/P/N/P/N structure may be extended in a region between the recess UCPC of the unit cell portion UCP and the periphery of the gate pad 18 so that the Zener diode surrounds the gate electrode 6C. This structure makes the PN junction width larger than that shown in FIG. 1 since the Zener diode surrounds the gate electrode 6C, in other words, the Zener diode is extended around the outside of the gate pad 18.

Figure 27:
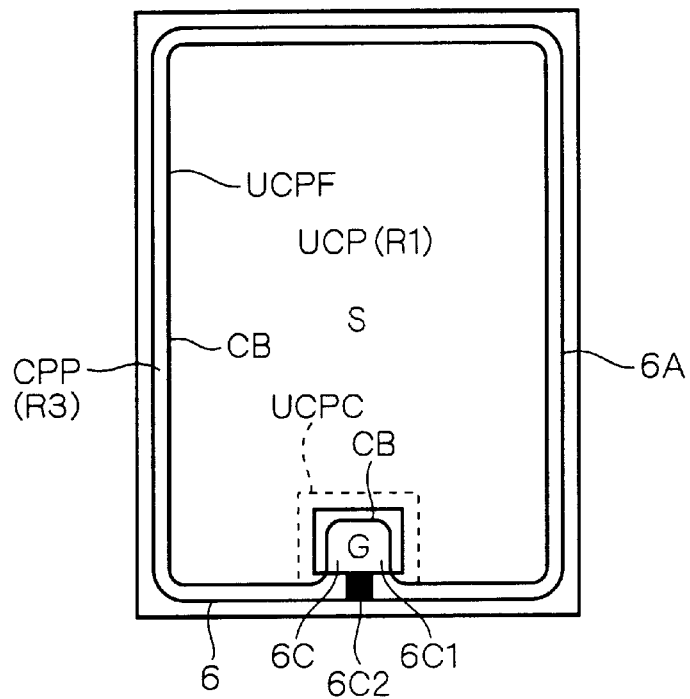
FIGS. 27 and 28 are plan views showing a structure of variations of the Zener-diode-containing power semiconductor device in accordance with any of the first to third preferred embodiments.
Figure 28:
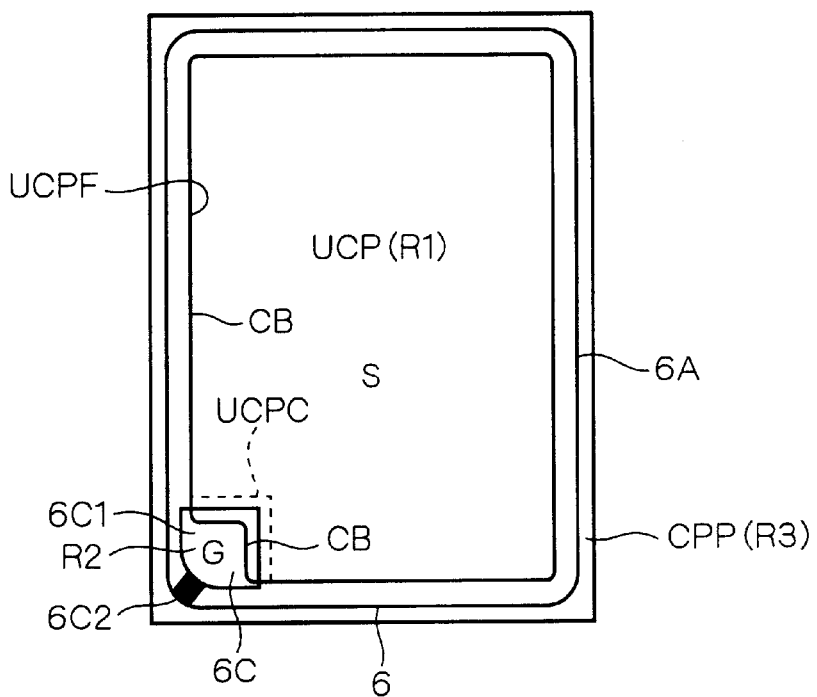

(4) Such a modified structure as shown in FIG. 27 or 28 may be adopted, where the chip periphery portion CPP does not surround the gate pad. In the structures shown in FIGS. 27 and 28, the Zener diode structure in the chip periphery portion CPP is extended also in the second region where the gate electrode 6C is situated. In FIGS. 27 and 28, the reference character CB denotes an inner end of the N/P/N/P/N structure.

While the invention has been described in detail, the foregoing description is in all aspects illustrative and not restrictive. It is understood that numerous other modifications and variations can be devised without departing from the scope of the invention.

What is claimed is:

1. A power semiconductor device comprising:

a semiconductor substrate;

a unit cell portion comprising a plurality of MOS-structure power semiconductor elements formed on a first region which occupies a central part of a main surface of said semiconductor substrate, said unit cell portion comprising a recessed part;

a gate pad portion comprising a wire-bonding-target gate electrode formed over a second region surrounded by said recessed part of said unit cell portion in said main surface of said semiconductor substrate; and a chip periphery portion comprising at least one Zener diode formed over a third region entirely surrounding at a periphery said unit cell portion in said main surface of said semiconductor substrate and said gate pad portion.

2. The power semiconductor device according to claim 1, wherein said chip periphery portion comprises one Zener diode, and said one Zener diode comprises n semiconductor regions arranged one outside another from the first region located on the side of said periphery of said unit cell portion to the n-th region located on the side of the periphery of said semiconductor substrate, said n semiconductor regions having alternating conductivity types and forming junctions one surrounding another along the periphery of said semiconductor substrate, said n being an odd number of three or larger.

3. The power semiconductor device according to claim 1, wherein said chip periphery portion comprises, a plurality of first Zener diodes, and a plurality of second Zener diodes, wherein each of said plurality of first Zener diodes comprises n semiconductor regions arranged one outside another from the first semiconductor region having a first conductivity type and located in the center, said n semiconductor regions having alternating conductivity types and forming junctions one surrounding another, said n being an odd number of three or larger, the n-th semiconductor region in each of said plurality of first Zener diodes having said first conductivity type, said first semiconductor region in each of said plurality of first Zener diodes being electrically connected, through a first contact hole formed on a surface of said first semiconductor region, to said wire-bonding-target gate electrode in said gate pad portion and to a first gate electrode layer of a corresponding first MOS-structure power semiconductor element provided in said unit cell portion, said n-th semiconductor region which is the outermost one in each of said plurality of first Zener diodes being electrically connected, through a second contact hole formed on a surface of said n-th semiconductor region, to one main electrode layer of said first MOS-structure power semiconductor element in said unit cell portion, and wherein each of said plurality of second Zener diodes comprises n semiconductor regions arranged one outside another from the first semiconductor region having said first conductivity type and located in the center, said n semiconductor regions having alternating conductivity types and forming junctions one surrounding another, said n being an odd number of three or larger, the n-th semiconductor region in each of said plurality of second Zener diodes having said first conductivity type, said n-th semiconductor region which is the outermost one in each of said plurality of second Zener diodes being electrically connected, through a third contact hole formed on a surface of said n-th semiconductor region, to said wire-bonding-target gate electrode in said gate pad portion and to a second gate electrode layer of a corresponding second MOS-structure power semiconductor element in said unit cell portion, said first semiconductor region in each of said plurality of second Zener diodes being electrically connected, through a fourth contact hole formed on a surface of said first semiconductor region, to one main electrode layer of said second MOS-structure power semiconductor element in said unit cell portion, said first gate electrode layer and said second gate electrode layer being electrically connected to each other.

4. The power semiconductor device according to claim 3, wherein a first sum total of first areas of said first contact holes of said plurality of first Zener diodes and third areas of said third contact holes of said plurality of second Zener diodes is equal to a second sum total of second areas of said second contact holes of said plurality of first Zener diodes and fourth areas of said fourth contact holes of said plurality of second Zener diodes.

5. The power semiconductor device according to claim 4, wherein said plurality of first Zener diodes and said plurality of second Zener diodes are alternately arranged along said periphery of said semiconductor substrate.

6. The power semiconductor device according to claim 5, wherein a common gate electrode layer is formed between adjacent ones of said first Zener diodes and said second Zener diodes in said chip periphery portion, said common gate electrode layer being connected to both of said first gate electrode layer and said second gate electrode layer, and said first semiconductor region of said first Zener diode and said n-th semiconductor region of said second Zener diode are electrically connected to each other through a fifth contact hole formed on a surface of said common gate electrode layer and a gate electrode interconnection filling said fifth contact hole.

* * * * *